United States Patent
Iwahashi et al.

(10) Patent No.: US 12,104,240 B2
(45) Date of Patent: Oct. 1, 2024

(54) SUBSTRATE WITH WATER-AND-OIL REPELLENT LAYER, VAPOR DEPOSITION MATERIAL, AND METHOD FOR PRODUCING SUBSTRATE WITH WATER-AND-OIL REPELLENT LAYER

(71) Applicant: AGC INC., Tokyo (JP)

(72) Inventors: Maemi Iwahashi, Tokyo (JP); Yoshihito Tokunaga, Tokyo (JP); Hirokazu Kodaira, Tokyo (JP); Kenji Ishizeki, Tokyo (JP); Daisuke Kobayashi, Tokyo (JP); Asako Anazawa, Tokyo (JP); Yusuke Tomiyori, Tokyo (JP)

(73) Assignee: AGC Inc., Tokyo (JP)

( * ) Notice: Subject to any disclaimer, the term of this patent is extended or adjusted under 35 U.S.C. 154(b) by 478 days.

(21) Appl. No.: 17/231,125

(22) Filed: Apr. 15, 2021

(65) Prior Publication Data

US 2021/0230735 A1    Jul. 29, 2021

Related U.S. Application Data

(63) Continuation of application No. PCT/JP2019/043963, filed on Nov. 8, 2019.

(30) Foreign Application Priority Data

Nov. 13, 2018 (JP) .................................. 2018-213072
Dec. 26, 2018 (JP) .................................. 2018-243170

(51) Int. Cl.
*C23C 14/08* (2006.01)
*C01B 3/12* (2006.01)
(Continued)

(52) U.S. Cl.
CPC .............. *C23C 14/08* (2013.01); *C01B 33/12* (2013.01); *C01B 33/20* (2013.01); *C01B 33/26* (2013.01); *C23C 14/10* (2013.01); *C23C 14/46* (2013.01)

(58) Field of Classification Search
None
See application file for complete search history.

(56) References Cited

U.S. PATENT DOCUMENTS

2017/0183255 A1*  6/2017  Walther ................. C03C 3/091
2018/0030280 A1*  2/2018  Mitsuhashi .......... C08G 65/007

FOREIGN PATENT DOCUMENTS

| CN | 101238394 A | 8/2008 |
|----|-------------|--------|
| JP | 2011063852 A | 3/2011 |

(Continued)

OTHER PUBLICATIONS

English translation of International Preliminary Report on Patentability and Written Opinion issued May 18, 2021 in PCT/JP2019/043963, 7 pages.

*Primary Examiner* — Ramsey Zacharia
(74) *Attorney, Agent, or Firm* — Element IP, PLC

(57) ABSTRACT

To provide a water/oil repellent layer-provided substrate having a water/oil repellent layer excellent in abrasion resistance, a deposition material and a method for producing a water/oil repellent layer-provided substrate.
The water/oil repellent layer-provided substrate of the present invention is a water/oil repellent layer-provided substrate comprising a substrate, an undercoat layer and a water/oil repellent layer in this order,
wherein the water/oil repellent layer comprises a condensate of a fluorinated compound having a reactive silyl group,
the undercoat layer contains an oxide containing silicon and at least one element selected from the group consisting of titanium, zirconium and aluminum, and (Continued)

the ratio of the total molar concentration of titanium, zirconium and aluminum in the undercoat layer to the molar concentration of silicon in the undercoat layer is from 0.03 to 0.7.

12 Claims, 1 Drawing Sheet

(51) Int. Cl.
*C01B 33/12* (2006.01)
*C01B 33/20* (2006.01)
*C01B 33/26* (2006.01)
*C23C 14/10* (2006.01)
*C23C 14/46* (2006.01)

(56) References Cited

FOREIGN PATENT DOCUMENTS

| | | |
|---|---|---|
| JP | 2012072272 A | 4/2012 |
| JP | 2013155399 A | 8/2013 |
| JP | 2014144551 A | 8/2014 |
| JP | 2014218639 A | 11/2014 |
| JP | 2017191302 A | 10/2017 |
| WO | WO-2017030046 A1 | 2/2017 |
| WO | WO-2017214675 A1 * 12/2017 ............. B05D 3/101 |

\* cited by examiner

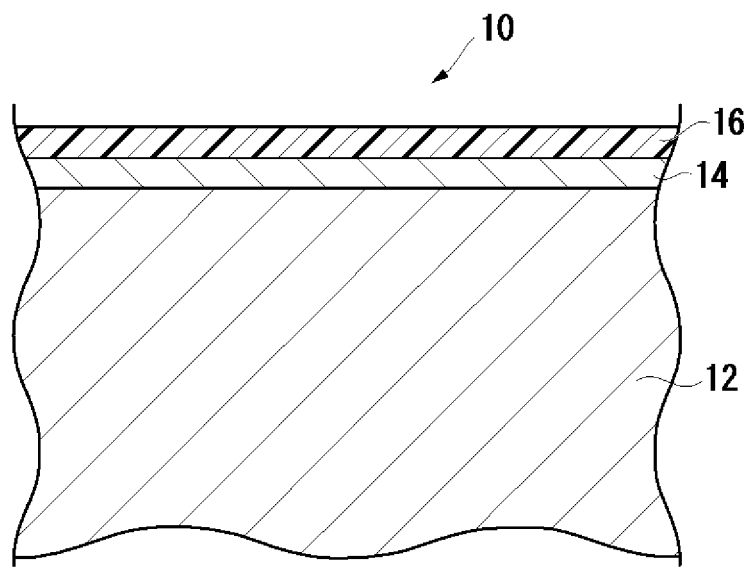

SUBSTRATE WITH WATER-AND-OIL REPELLENT LAYER, VAPOR DEPOSITION MATERIAL, AND METHOD FOR PRODUCING SUBSTRATE WITH WATER-AND-OIL REPELLENT LAYER

TECHNICAL FIELD

The present invention relates to a water/oil repellent layer-provided substrate, a deposition material, and a method for producing a water/oil repellent layer-provided substrate.

BACKGROUND ART

In order to impart to the surface of a substrate water/oil repellency, fingerprint stain removability, lubricity (smoothness when touched with a finger), etc., it has been known to form a water/oil repellent layer comprising a condensate of a fluorinated compound on the surface of the substrate by surface treatment using a fluorinated compound having a poly(oxyperfluoroalkylene) chain and a hydrolysable silyl group.

Further, since the water/oil repellent layer is required to have abrasion resistance, in order to improve adhesion between the substrate and the water/oil repellent layer, an undercoat layer is formed between them. For example, Patent Documents 1 and 2 disclose to form a silicon oxide layer by deposition between the substrate and the water/oil repellent layer.

PRIOR ART DOCUMENTS

Patent Documents

Patent Document 1: JP-A-2014-218639
Patent Document 2: JP-A-2012-72272

DISCLOSURE OF INVENTION

Technical Problem

In recent years, performance required for the water/oil repellent layer becomes higher and for example, a water/oil repellent layer more excellent in abrasion resistance has been required.

The present inventors have evaluated a water/oil repellent layer-provided substrate having the undercoat layer (silicon oxide layer) as disclosed in Patent Documents 1 and 2 and as a result, found that the abrasion resistance of the water/oil repellent layer can further be improved.

Under these circumstances, the object of the present invention is to provide a water/oil repellent layer-provided substrate having a water/oil repellent layer excellent in abrasion resistance, a deposition material and a method for producing a water/oil repellent layer-provided substrate.

Solution to Problem

The present inventors have conducted extensive studies on the above object and as a result, have found that a water/oil repellent layer-provided substrate having a water/oil repellent layer excellent in abrasion resistance can be obtained by using an undercoat layer containing an oxide containing silicon and at least one element selected from the group consisting of titanium, zirconium and aluminum, the ratio of the total molar concentration of titanium, zirconium and aluminum to the molar concentration of silicon being within the predetermined range, and have accomplished the present invention.

That is, the present inventors have found that the above object can be achieved by the following constitutions.

[1] A water/oil repellent layer-provided substrate comprising a substrate, an undercoat layer and a water/oil repellent layer in this order,
wherein the water/oil repellent layer comprises a condensate of a fluorinated compound having a reactive silyl group,
the undercoat layer contains an oxide containing silicon and at least one element selected from the group consisting of titanium, zirconium and aluminum, and
the ratio of the total molar concentration of titanium, zirconium and aluminum in the undercoat layer to the molar concentration of silicon in the undercoat layer is from 0.03 to 0.7.

[2] The water/oil repellent layer-provided substrate according to [1], wherein the oxide contains silicon, and at least one element selected from the group consisting of titanium and zirconium.

[3] The water/oil repellent layer-provided substrate according to [1], wherein the oxide contains silicon and titanium.

[4] The water/oil repellent layer-provided substrate according to any one of [1] to [3], wherein the oxide further contains an alkali metal element.

[5] The water/oil repellent layer-provided substrate according to [4], wherein the ratio of the molar concentration of the alkali metal element to the molar concentration of silicon is at most 1.0.

[6] The water/oil repellent layer-provided substrate according to any one of [1] to [5],
wherein the fluorinated compound is a fluorinated ether compound having a poly(oxyfluoroalkylene) chain and a reactive silyl group.

[7] A deposition material to be used for forming an undercoat layer of a water/oil repellent layer comprising a condensate of a fluorinated compound having a reactive silyl group, wherein the deposition material contains an oxide containing silicon and at least one element selected from the group consisting of titanium, zirconium and aluminum, and the ratio of the total molar concentration of titanium, zirconium and aluminum to the molar concentration of silicon is from 0.2 to 4.

[8] The deposition material according to [7], wherein the oxide contains silicon and at least one element selected from the group consisting of titanium and zirconium.

[9] The deposition material according to [7], wherein the oxide contains silicon and titanium.

[10] The deposition material according to any one of [7] to [9], wherein the oxide further contains an alkali metal element.

[11] The deposition material according to any one of [7] to [10], wherein the oxide further contains at least one metal element selected from the group consisting of nickel, iron, molybdenum and tungsten, and the ratio of the molar concentration of the metal element to the molar concentration of silicon is at most 0.01.

[12] The deposition material according to any one of [7] to [11], which is in the form of a molten body, a sintered body or granules.

[13] A method for producing a water/oil repellent layer-provided substrate comprising a substrate, an undercoat layer and a water/oil-repellent layer in this order, which comprises forming on the substrate the undercoat layer containing an oxide containing silicon and at least one element selected from the group consisting of titanium, zirconium and aluminum, the ratio of the total molar concentration of titanium, zirconium and aluminum to the molar concentration of silicon being from 0.03 to 0.7, by deposition method using the deposition material as defined in any one of [7] to [12], and forming on the undercoat layer the water/oil repellent layer comprising a condensate of a fluorinated compound having a reactive silyl group.

[14] A method for producing a water/oil repellent layer-provided substrate comprising a substrate, an undercoat layer and a water/oil-repellent layer in this order, which comprises forming on the substrate the undercoat layer containing an oxide containing silicon and at least one element selected from the group consisting of titanium, zirconium and aluminum, the ratio of the total molar concentration of titanium, zirconium and aluminum to the molar concentration of silicon being from 0.03 to 0.7, by wet coating method using a coating fluid containing a compound containing silicon, at least one compound selected from the group consisting of a compound containing titanium, a compound containing zirconium and a compound containing aluminum, and a liquid medium, and forming on the undercoat layer the water/oil repellent layer comprising a condensate of a fluorinated compound having a reactive silyl group.

Advantageous Effects of Invention

According to the present invention, it is possible to provide a water/oil repellent layer-provided substrate having a water/oil repellent layer excellent in abrasion resistance, a deposition material and a method for producing a water/oil repellent layer-provided substrate.

BRIEF DESCRIPTION OF DRAWING

FIG. 1 is a cross sectional view schematically illustrating an example of a water/oil repellent layer-provided substrate of the present invention.

DESCRIPTION OF EMBODIMENTS

In this specification, the units represented by the formula (1) will be referred to as "units (1)". The same applies to units represented by other formulae. The group represented by the formula (2) will be referred to as "group (2)". The same applies to groups represented by other formulae. The compound represented by the formula (3) will be referred to as "compound (3)". The same applies to compounds represented by other formulae.

In this specification, the wording "the alkylene group may have a group A" means that the alkylene group may have the group A between carbon-carbon atoms of the alkylene group, or may have the group A at the terminal, i.e. the alkylene group-group A-.

Meanings of the following terms in this specification are as follows.

A "bivalent organopolysiloxane residue" is a group represented by the following formula. $R^x$ in the following formula is an alkyl group (preferably $C_{1-10}$) or a phenyl group. g1 is an integer of at least 1, preferably an integer of from 1 to 9, particularly preferably from 1 to 4.

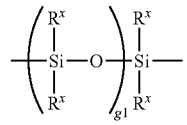

A "silphenylene skeleton group" is a group represented by $—Si(R^y)_2PhSi(R^y)_2—$ (wherein Ph is a phenylene group, and $R^y$ is a monovalent organic group). $R^y$ is preferably an alkyl group (preferably $C_{1-10}$).

A "dialkylsilylene group" is a group represented by $—Si(R^Z)_2—$ (wherein $R^Z$ is an alkyl group (preferably $C_{1-10}$)).

The "number average molecular weight" of a compound is calculated by obtaining the number (average value) of oxyfluoroalkylene groups on the basis of the terminal group, by $^1$H-NMR and $^{19}$F-NMR.

The content of each element in the undercoat layer is a value measured by X-ray photoelectron spectroscopy (XPS) depth profiling by ion sputtering, unless otherwise specified. The content of each element obtained by XPS analysis is represented by molar concentration (mol %). Specifically, from the depth profile of the molar concentration (mol %) in the vertical axis obtained by ion sputtering in XPS analysis, the average molar concentration (mol %) of each element in the undercoat layer is obtained, which is taken as the molar concentration (mol %) of each element. The measurement interval in the depth profile is preferably at most 1 nm as a depth calculated using a sputtering rate of a thermally oxidized film ($SiO_2$ film) having a known film thickness on a silicon wafer.

The content of each element in the deposition material is a value measured by wet analysis unless otherwise specified. The content of each element obtained by wet analysis is represented by mass percent concentration (mass %). Atomic absorption spectrometry is employed for measurement of alkali metal elements (Li, Na, K, Rb and Cs), and inductively coupled plasma (ICP) atomic emission spectrometry or ICP mass spectrometry is employed for measurement of the other elements, and quantitative determination is conducted by analytical curve (matrix matching) method. From mass % of each element obtained by wet analysis and the atomic weight (g/mol) of each element, the ratio of the molar concentrations of the respective elements can be obtained. The atomic weights used for calculation are as follows.

Atomic weight of Si (g/mol): 28.09
Atomic weight of Ti (g/mol): 47.88
Atomic weight of Zr (g/mol): 91.22
Atomic weight of Al (g/mol): 26.98
Atomic weight of Li (g/mol): 6.941
Atomic weight of Na (g/mol): 22.99
Atomic weight of K (g/mol): 39.10
Atomic weight of Rb (g/mol): 85.47
Atomic weight of Cs (g/mol): 132.9
Atomic weight of Ni (g/mol): 58.69
Atomic weight of Fe (g/mol): 55.85
Atomic weight of Mo (g/mol): 95.94
Atomic weight of W (g/mol): 183.8
Atomic weight of B (g/mol): 10.81

The dimensional ratio in FIG. 1 is different from actual one for explanatory convenience.

[Water/Oil Repellent Layer-Provided Substrate]

The water/oil repellent layer-provided substrate of the present invention is a water/oil repellent layer-provided substrate comprising a substrate, an undercoat layer and a water/oil repellent layer in this order, wherein the water/oil repellent layer comprises a condensate of a fluorinated compound having a reactive silyl group.

Further, the undercoat layer contains an oxide containing silicon and at least one element selected from the group consisting of titanium, zirconium and aluminum, and the ratio of the total molar concentration of titanium, zirconium and aluminum in the undercoat layer to the molar concentration of silicon in the undercoat layer is from 0.03 to 0.7.

Of the water/oil repellent layer-provided substrate of the present invention, the water/oil repellent layer is excellent in abrasion resistance. The details of the reason have not yet been clearly understood but are estimated as follows. The undercoat layer containing an oxide containing silicon and at least one element selected from the group consisting of titanium, zirconium and aluminum as well tends to have a high hardness as compared with an undercoat layer comprising silicon oxide. Thus, the undercoat layer can be prevented from being scarred. Further, since silicon has a strong bonding strength to the silanol group in the water/oil repellent layer formed on the undercoat layer, by the undercoat layer containing silicon, the adhesion between the undercoat layer and the water/oil repellent layer formed on the undercoat layer will be excellent. It is estimated that the water/oil repellent layer is less likely to be damaged by abrasion accordingly.

Further, titanium oxide has a photocatalytic function thereby keeps surface cleanness, and by the silanol groups being exposed to the surface of the undercoat layer in a large amount, the number of bonding to the water/oil repellent layer tends to be large. Accordingly, when the undercoat layer contains titanium, the water/oil repellent layer will be particularly excellent in abrasion resistance.

FIG. 1 is a cross sectional view schematically illustrating an example of a water/oil repellent layer-provided substrate of the present invention. The water/oil repellent layer-provided substrate 10 comprises a substrate 12, an undercoat layer 14 formed on one surface of the substrate 12 and a water/oil repellent layer 16 formed on the surface of the undercoat layer 14.

In the example shown in FIG. 1, the substrate 12 and the undercoat layer 14 are in contact with each other, but the structure is not limited thereto, and the water/oil repellent layer-provided substrate may have other layer which is not shown between the substrate 12 and the undercoat layer 14. Further, in the example shown in FIG. 1, the undercoat layer 14 and the water/oil repellent layer 16 are in contact with each other, but the structure is not limited thereto, and the water/oil repellent layer-provided substrate may have other layer which is not shown between the undercoat layer 14 and the water/oil repellent layer 16.

In the example shown in FIG. 1, the undercoat layer 14 is formed entirely on one surface of the substrate 12, but the structure is not limited thereto, and the undercoat layer 14 may be formed only on a part of the substrate 12. Further, in the example shown in FIG. 1, the water/oil repellent layer 16 is formed entirely on the undercoat layer 14, but the structure is not limited thereto, and the water/oil repellent layer 16 may be formed only on a part of the undercoat layer 14.

In the example shown in FIG. 1, the undercoat layer 14 and the water/oil repellent layer 16 are formed only on one surface of the substrate 12, but the structure is not limited thereto, and the undercoat layer 14 and the water/oil repellent layer 16 may be formed on both surfaces of the substrate 12.

(Substrate)

The substrate is, since the water/oil repellency can be imparted, particularly preferably a substrate which is required to have water/oil repellency imparted. As specific examples of a material of the substrate, a metal, a resin, glass, sapphire, a ceramic, a stone, and a composite material thereof may be mentioned. Glass may be chemically tempered.

As the substrate, a substrate for a touch panel or a substrate for a display is preferred, and a substrate for a touch panel is particularly preferred. The substrate for a touch panel preferably has translucency. "Having translucency" means that the normal incidence visible light transmittance in accordance with JIS R3106: 1998 (ISO9050: 1990) is at least 25%. As a material of the substrate for a touch panel, glass or a transparent resin is preferred.

Further, as the substrate, the following examples may be mentioned. A building material, a decorative building material, an interior article, a transport equipment (such as an automobile), an advertising display/sign-board, tableware, an aquarium, a decorative device (such as a frame or a box), laboratory ware, furniture, glass or a resin to be used for art/sports/game, or glass or a resin to be used for an exterior portion (excluding the display portion) of a device such as a mobile phone (such as a smartphone), a personal digital assistant, a gaming machine or a remote controller, are also preferred. The shape of the substrate may be a plate form or a film form.

The substrate may be a substate having either one of or both surfaces subjected to surface treatment such as corona discharge treatment, plasma treatment or plasma graft polymerization treatment. The surface-treated surface achieves more excellent adhesion of the substrate and the undercoat layer and as a result, the water/oil repellent layer will be more excellent in abrasion resistance. Thus, it is preferred to apply surface treatment to the surface of the substrate on the side to be in contact with the undercoat layer.

(Undercoat Layer)

The undercoat layer is a layer containing an oxide containing silicon and at least one element selected from the group consisting of titanium, zirconium and aluminum.

The oxide may contain only one or may contain two or more of titanium, zirconium and aluminum, and it preferably contains at least one element selected from the group consisting of titanium and zirconium, particularly preferably contains titanium. In a case where the oxide contains three of titanium, zirconium and aluminum, the proportion of the total amount of titanium and zirconium to the total amount of the three is preferably at least 20 mol %. In a case where the oxide contains two of titanium and zirconium, the proportion of the amount of titanium to the total amount of the two is preferably at least 50 mol %.

The oxide contained in the undercoat layer may be a mixture of oxides each containing only one of the above elements (silicon, titanium, zirconium and aluminum) (for example, a mixture of silicon oxide and at least one oxide selected from the group consisting of titanium oxide, zirconium oxide and aluminum oxide), may be a composite oxide containing two or more of the above elements, or may be a mixture of the oxide containing one of the above elements and the composite oxide.

The content of the oxide in the undercoat layer is, to the total mass of the undercoat layer, in that the water/oil repellent layer will be more excellent in abrasion resistance, preferably at least 80 mass %, more preferably at least 95 mass %, particularly preferably 100 mass % (the undercoat layer is entirely formed of the oxide).

The content of oxygen in the undercoat layer is, as the molar concentration (mol %) of oxygen atoms to all the elements in the undercoat layer, in that the water/oil repellent layer will be more excellent in abrasion resistance, preferably from 40 to 70 mol %, more preferably from 50 to 70 mol %, particularly preferably from 60 to 70 mol %. The content of oxygen in the undercoat layer is measured by depth profiling by XPS by ion sputtering.

The content of silicon in the undercoat layer is, as the molar concentration (mol %) of silicon to all the elements excluding oxygen in the undercoat layer, in that the water/oil repellent layer will be more excellent in abrasion resistance, preferably from 16 to 99.6 mol %, more preferably from 30 to 99.4 mol %, particularly preferably from 40 to 99.1 mol %.

The content of silicon in the undercoat layer is, as the mass percent concentration (mass %) of silicon to all the elements excluding oxygen in the undercoat layer, in that the water/oil repellent layer will be more excellent in abrasion resistance, preferably from 10 to 99.6 mass %, more preferably from 15 to 99.5 mass %, particularly preferably from 20 to 99.2 mass %.

The ratio of the total molar concentration of titanium, zirconium and aluminum in the undercoat layer to the molar concentration of silicon in the undercoat layer is from 0.03 to 0.7 and in that the water/oil repellent layer will be more excellent in abrasion resistance, preferably from 0.08 to 0.6, particularly preferably from 0.10 to 0.50.

The total content of titanium, zirconium and aluminum in the undercoat layer is, as the total molar concentration (mol %) of titanium, zirconium and aluminum to all the elements excluding oxygen in the undercoat layer, in that the water/oil repellent layer will be more excellent in abrasion resistance, preferably from 3 to 40 mol %, more preferably from 7 to 38 mol %, particularly preferably from 9 to 33 mol %.

The total content of titanium, zirconium and aluminum in the undercoat layer is, as the total mass percent concentration (mass %) of titanium, zirconium and aluminum to all the elements excluding oxygen in the undercoat layer, in that the water/oil repellent layer will be more excellent in abrasion resistance, preferably from 5 to 54 mass %, more preferably from 10 to 52 mass %, particularly preferably from 15 to 46 mass %.

The total content of titanium, zirconium and aluminum means, when one element among titanium, zirconium and aluminum is contained, the content of the one element, and when two or more types of elements are contained, the total content of the respective elements.

The oxide contained in the undercoat layer may further contain an alkali metal element, in that the water/oil repellent layer will be more excellent in abrasion resistance.

The alkali metal element may, for example, be specifically lithium, sodium, potassium, rubidium or cesium, and in that the water/oil repellent layer will be more excellent in abrasion resistance, preferably sodium, lithium or potassium, particularly preferably sodium. As the alkali metal element, two or more types may be contained.

The alkali metal element may be present in the form of an oxide of one type of alkali metal element, or may be present in the form of a composite oxide of one or more types of alkali metal element and the above element (silicon, titanium, zirconium or aluminum).

In a case where the oxide contained in the undercoat layer contains the alkali metal element, the ratio of the total molar concentration of the alkali metal element in the undercoat layer to the molar concentration of silicon in the undercoat layer is, in that the water/oil repellent layer will be more excellent in abrasion resistance, preferably at most 1.0, particularly preferably from 0.001 to 0.5.

In a case where the oxide contained in the undercoat layer contains the alkali metal element, the content of the alkali metal element in the undercoat layer is, as the total molar concentration (mol %) of the alkali metal element to all the elements excluding oxygen in the undercoat layer, in that the water/oil repellent layer will be more excellent in abrasion resistance, preferably at most 30 mol %, more preferably at most 20 mol %, particularly preferably from 0.1 to 15 mol %.

In a case where the oxide contained in the undercoat layer contains the alkali metal element, the content of the alkali metal element in the undercoat layer is, as the mass percent concentration (mass %) of the alkali metal element to all the elements excluding oxygen in the undercoat layer, in that the water/oil repellent layer will be more excellent in abrasion resistance, preferably at most 40 mass %, more preferably at most 30 mass %, particularly preferably from 0.1 to 20 mass %.

The content of the alkali metal element means, when one type of alkali metal element is contained, the content of the one element, and when two or more types of alkali metal elements are contained, the total content of the respective elements.

The oxide contained in the undercoat layer may further contain boron, whereby the water/oil repellent layer will be more excellent in abrasion resistance.

Boron may be present in the form of an oxide of boron by itself, or may be present in the form of a composite oxide of boron and the above element (silicon, titanium, zirconium or aluminum).

In a case where the oxide contained in the undercoat layer contains boron, the ratio of the molar concentration of boron in the undercoat layer to the molar concentration of silicon in the undercoat layer is, in that the water/oil repellent layer will be more excellent in abrasion resistance, preferably at most 1.0, particularly preferably from 0.001 to 0.5.

In a case where the oxide contained in the undercoat layer contains boron, the content of boron in the undercoat layer is, as the molar concentration (mol %) of boron to all the elements excluding oxygen in the undercoat layer, in that the water/oil repellent layer will be more excellent in abrasion resistance, preferably at most 25 mol %, more preferably at most 20 mol %, particularly preferably from 0.1 to 15 mol %.

In a case where the oxide contained in the undercoat layer contains boron, the content of boron in the undercoat layer is, as the mass percent concentration (mass %) of boron to all the elements excluding oxygen in the undercoat layer, in that the water/oil repellent layer will be more excellent in abrasion resistance, preferably at most 15 mass %, more preferably at most 13 mass %, particularly preferably from 0.1 to 10 mass %.

The undercoat layer may be a layer in which components contained are uniformly distributed (hereinafter sometimes referred to as "homogeneous layer") or may be a layer in which components contained are non-uniformly distributed (hereinafter sometimes referred to as "inhomogeneous layer"). The inhomogeneous layer may, for example, be specifically a layer in which there is a concentration gradient (horizontally or vertically to a plane of the layer) of the components (gradation structure) or a layer in which in a continuous component, other components are discontinuously present (sea-island structure). Specifically, a case where the concentration of the compound containing titanium, the compound containing zirconium, the compound containing aluminum or the like increases towards the surface (surface on the opposite side from the substrate) relative to silicon oxide (silica), a case where portions at which the concentration of the compound containing titanium, the compound containing zirconium, the compound containing aluminum or the like is high are dotted in the silica matrix, or a case where silica and the compound containing titanium, the compound containing zirconium, the compound containing aluminum or the like form a checkered pattern, may, for example, be mentioned.

The undercoat layer may be a monolayer or may be a multilayer, and from the viewpoint of the process, preferably a monolayer.

The undercoat layer may have irregularities on its surface.

The thickness of the undercoat layer is preferably from 1 to 100 nm, more preferably from 1 to 50 nm, particularly preferably from 2 to 20 nm. When the thickness of the undercoat layer is at least the above lower limit value, the adhesion of the water/oil repellent layer by the undercoat layer will more improve, and the water/oil repellent layer will be more excellent in abrasion resistance. When the thickness of the undercoat layer is at most the above upper limit value, the undercoat layer itself will be excellent in abrasion resistance.

The thickness of the undercoat layer is measured by observation of the cross section of the undercoat layer with a transmission electron microscope (TEM).

(Water/Oil Repellent Layer)

The water/oil repellent layer comprises a condensate of a fluorinated compound having a reactive silyl group.

The reactive silyl group means a hydrolysable silyl group and a silanol group (Si—OH). As a specific example of the hydrolysable silyl group, a group represented by the after-described formula (2) wherein L is a hydrolysable group may be mentioned.

The hydrolysable silyl group becomes a silanol group represented by Si—OH by being hydrolyzed. The silanol groups further undergo dehydration condensation reaction to form a Si—O—Si bond. The silanol group undergoes dehydration condensation reaction with a silanol group derived from the oxide contained in the undercoat layer to form a Si—O—Si bond. That is, in a case where at least part of the reactive silyl groups are hydrolysable silyl groups, the water/oil repellent layer contains a condensate having the reactive silyl groups of the fluorinated compound being hydrolyzed and subjected to dehydration condensation reaction. In a case where all the reactive silyl groups are silanol groups, the water/oil repellent layer contains a condensate having silanol groups of the fluorinated compound subjected to dehydration condensation reaction. The reactive silyl groups of the fluorinated compound are preferably such that at least a part thereof are hydrolysable silyl groups.

The thickness of the water/oil repellent layer is preferably from 1 to 100 nm, particularly preferably from 1 to 50 nm. When the thickness of the water/oil repellent layer is at least the lower limit value, effects by the water/oil repellent layer will be sufficiently obtained. When the thickness of the water/oil repellent layer is at most the above upper limit value, high utilization efficiency will be obtained.

The thickness of the water/oil repellent layer is calculated from the oscillation period of an interference pattern of reflected X-rays obtained by X-ray reflectometry (XRR) using an X-ray diffractometer for thin film analysis.

<Fluorinated Compound Having Reactive Silyl Group>

The fluorinated compound having a reactive silyl group is, in that the water/oil repellent layer will be excellent in water/oil repellency, preferably a fluorinated ether compound having a poly(oxyfluoroalkylene) chain and a reactive silyl group.

The poly(oxyfluoroalkylene) chain contains a plurality of units represented by the formula (1):

$$(OX) \tag{1}$$

X is a fluoroalkylene group having at least one fluorine atom.

The number of carbon atoms in the fluoroalkylene group is preferably from 1 to 6, particularly preferably from 2 to 4, in that the water/oil repellent layer will be more excellent in weather resistance and corrosion resistance.

The fluoroalkylene group may be linear or branched, and in that more excellent effects of the present invention will be obtained, preferably linear.

The number of fluorine atoms in the fluoroalkylene group is, in that the water/oil repellent layer will be more excellent in corrosion resistance, preferably from 1 to 2 times the number of carbon atoms, particularly preferably from 1.7 to 2 times.

The fluoroalkylene group may be a group having all the hydrogen atoms in the fluoroalkylene group substituted by fluorine atoms (perfluoroalkylene group).

As specific examples of the units 1, —OCHF—, —OCF$_2$CHF—, —OCHFCF$_2$—, —OCF$_2$CH$_2$—, —OCH$_2$CF$_2$—, —OCF$_2$CF$_2$CHF—, —OCHFCF$_2$CF$_2$—, —OCF$_2$CF$_2$CH$_2$—, —OCH$_2$CF$_2$CF$_2$—, —OCF$_2$CF$_2$CF$_2$CH$_2$—, —OCH$_2$CF$_2$CF$_2$CF$_2$—, —OCF$_2$CF$_2$CF$_2$CF$_2$CH$_2$—, —OCH$_2$CF$_2$CF$_2$CF$_2$CF$_2$—, —OCF$_2$CF$_2$CF$_2$CF$_2$CF$_2$CH$_2$—, —OCH$_2$CF$_2$CF$_2$CF$_2$CF$_2$CF$_2$—, —OCF$_2$—, —OCF$_2$CF$_2$—, —OCF$_2$CF$_2$CF$_2$—, —OCF(CF$_3$)CF$_2$—, —OCF$_2$CF$_2$CF$_2$CF$_2$—, —OCF(CF$_3$)CF$_2$CF$_2$—, —OCF$_2$CF$_2$CF$_2$CF$_2$CF$_2$—, —OCF$_2$CF$_2$CF$_2$CF$_2$CF$_2$CF$_2$— may be mentioned.

The number m of repetition of the units (1) contained in the poly(oxyfluoroalkylene) chain is at least 2, preferably an integer of from 2 to 200, more preferably an integer of from 5 to 150, particularly preferably an integer of from 5 to 100, most preferably an integer of from 10 to 50.

The poly(oxyfluoroalkylene) chain may contain two or more types of the units (1). The two or more types of the units (1) may, for example, be two or more types of the units (1) differing in the number of carbon atoms, two or more types of the units (1) having the same number of carbon atoms but differing in whether the units have a side chain or not or in the type of the side chain, or two or more types of the units (1) having the same number of carbon atoms but differing in the number of fluorine atoms.

The bonding order of the two or more types of (OX) is not limited, and they may be arranged randomly, alternately or in blocks.

The poly(oxyfluoroalkylene) chain is preferably a poly (oxyfluoroalkylene) chain composed mainly of the units (1) as the oxyperfluoroalkylene group, in order to obtain a film excellent in fingerprint stain removability. In the poly (oxyfluoroalkylene) chain represented by $(OX)_m$, the proportion of the number of the units (1) as the oxyperfluoroalkylene group to the total number m of the units (1) is preferably from 50 to 100%, more preferably from 80 to 100%, particularly preferably from 90 to 100%.

The poly(oxyfluoroalkylene) chain is more preferably a poly(oxyperfluoroalkylene) chain or a poly(oxyperfluoroalkylene) chain having one or two oxyfluoroalkylene units having a hydrogen atom on one terminal or on both terminals.

$(OX)_m$ which the poly(oxyfluoroalkylene) chain has is preferably $(OCH_{ma}F_{(2-ma)})_{m11}$ $(OC_2H_{mb}F_{(4-mb)})_{m12}$ $(OC_3H_{mc}F_{(6-mc)})_{m13}(OC_4H_{md}F_{(8-md)})_{m14}(OC_5H_{me}F_{(10-me)})_{m15}(OC_6H_{mf}F_{(12-mf)})_{m16}$.

ma is 0 or 1, mb is an integer of from 0 to 3, mc is an integer of from 0 to 5, md is an integer of from 0 to 7, me is an integer of from 0 to 9, and mf is an integer of from 0 to 11.

m11, m12, m13, m14, m15 and m16 are each independently an integer of at least 0, and preferably at most 100. m11+m12+m13+m14+m15+m16 is an integer of at least 2, preferably an integer of from 2 to 200, more preferably an integer of from 5 to 150, further preferably an integer of from 5 to 100, particularly preferably an integer of from 10 to 50.

Particularly, m12 is preferably an integer of at least 2, particularly preferably an integer of from 2 to 200.

Further, $C_3H_{mc}F_{(6-mc)}$, $C_4H_{md}F_{(8-md)}$, $C H_{me}F_{(10-me)}$ and $C_6H_{mf}F_{(12-mf)}$ may be linear or branched, and in that the water/oil repellent layer will be more excellent in abrasion resistance, preferably linear.

The above formula represents the type and number of units, and does not represent arrangement of the units. That is, m11 to m16 represent the number of units, and for example, $(OCH_{ma}F_{(2-ma)})_{m11}$ does not necessarily represent a block of continuous m11 $(OCH_{ma}F_{(2-ma)})$ units. Likewise, the order of description of $(OCH_{ma}F_{(2-ma)})$ to $(OC_6H_{mf}F_{(12-mf)})$ does not represent arrangement of them in the order of description.

In the above formula, in a case where two or more of m11 to m16 are not 0 (that is, $(OX)_m$ consists of two or more types of units), the arrangement of different units may be random, alternate, in blocks, or a combination thereof.

Further, in a case where two or more of each of the above units are contained, they may be different. For example, in a case where m11 is 2 or more, the plurality of $(OCH_{ma}F_{(2-ma)})$ may be the same or different.

The reactive silyl group is preferably a group represented by the formula (2):

$$—Si(R)_nL_{3-n} \quad (2)$$

The number of the group (2) in the fluorinated ether compound is one or more, and in that the water/oil repellent layer will be more excellent in abrasion resistance, preferably two or more, more preferably from 2 to 10, further preferably from 2 to 5, particularly preferably 2 or 3.

In a case where there are two or more groups (2) in one molecule, the two or more groups (2) may be the same or different. In view of availability of materials and production efficiency of the fluorinated ether compound, the two or more groups (2) are preferably the same.

R is a monovalent hydrocarbon group, preferably a saturated monovalent hydrocarbon group. The number of carbon atoms in R is preferably from 1 to 6, more preferably from 1 to 3, particularly preferably from 1 to 2.

L is a hydrolysable group or a hydroxy group.

The hydrolysable group is a group which becomes a hydroxy group by being hydrolyzed. That is, a hydrolysable silyl group represented by Si-L becomes a silanol group represented by Si—OH by being hydrolyzed. The silanol groups further react with each other to form a Si—O—Si bond. Further, the silanol group undergoes dehydration condensation reaction with a silanol group derived from the oxide contained in the undercoat layer to form a Si—O—Si bond.

The hydrolysable group may, for example, be specifically an alkoxy group, an aryloxy group, a halogen atom, an acyl group, an acyloxy group or an isocyanate group (—NCO). The alkoxy group is preferably a $C_{1-4}$ alkoxy group. The aryloxy group is preferably a $C_{3-10}$ aryloxy group. The aryl group in the aryloxy group includes a heteroaryl group. The halogen atom is preferably a chlorine atom. The acyl group is preferably a $C_{1-6}$ acyl group. The acyloxy group is preferably a $C_{1-6}$ acyloxy group.

L is, in view of more easy production of the fluorinated ether compound, preferably a $C_{1-4}$ alkoxy group or a halogen atom. L is, in that outgassing at the time of coating is small and the fluorinated ether compound will be more excellent in storage stability, preferably a $C_{1-4}$ alkoxy group, and in a case where the fluorinated ether compound is required to have long-term storage stability, particularly preferably an ethoxy group, and in a case where the reaction time after coating is to be short, particularly preferably a methoxy group.

In the present invention, as compared with a case where the undercoat layer is formed only of silica, the hydrolysis and the condensation reaction of the reactive silyl group in the fluorinated ether compound are promoted. Accordingly, even when the fluorinated ether compound having a reactive silyl group is used which hardly undergoes reaction if the undercoat layer is formed only of silica, the water/oil repellent layer will be excellent in abrasion resistance.

n is an integer of from 0 to 2.

n is preferably 0 or 1, particularly preferably 0. By the presence of a plurality of L, adhesion of the water/oil repellent layer to the substrate will be stronger.

When n is 1 or less, the plurality of L present in one molecule may be the same or different. In view of availability of materials and production efficiency of the fluorinated ether compound, they are preferably the same. When n is 2, the plurality of R present in one molecule may the same or different. In view of availability of materials and production efficiency of the fluorinated ether compound, they are preferably the same.

The fluorinated ether compound is, in that the water/oil repellent layer will be more excellent in water/oil repellency and abrasion resistance, preferably a compound represented by the formula (3):

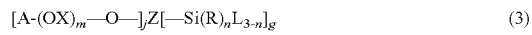

$$[A\text{-}(OX)_m\text{—}O\text{—}]_jZ[\text{—}Si(R)_nL_{3-n}]_g \quad (3)$$

A is a perfluoroalkyl group or $\text{-}Q[\text{-}Si(R)_nL_{3-n}]_k$

The number of carbon atoms in the perfluoroalkyl group is, in that the water/oil repellent layer will be more excellent in abrasion resistance, preferably from 1 to 20, more preferably from 1 to 10, further preferably from 1 to 6, particularly preferably from 1 to 3.

The perfluoroalkyl group may be linear or branched.

When A is $\text{-}Q[\text{-}Si(R)_nL_{3-n}]_k$, j is 1.

The perfluoroalkyl group may, for example, be $CF_3$—, $CF_3CF_2$—, $CF_3CF_2CF_2$—, $CF_3CF_2CF_2CF_2$—, $CF_3CF_2CF_2CF_2CF_2$—, $CF_3CF_2CF_2CF_2CF_2CF_2$—, or $CF_3CF(CF_3)$—.

The perfluoroalkyl group is, in that the water/oil repellent layer will be more excellent in water/oil repellency, preferably $CF_3$—, $CF_3CF_2$—, or $CF_3CF_2CF_2$—.

Q is a (k+1) valent linking group. As described hereinafter, k is an integer of from 1 to 10. Accordingly, Q is a bivalent to undecavalent linking group.

Q may be any group which does not impair the effects of the present invention, and may, for example, be an alkylene group which may have an etheric oxygen atom or a bivalent organopolysiloxane residue, a carbon atom, a nitrogen atom, a silicon atom, a bivalent to octavalent organopolysiloxane residue, or the after described groups (g2-1) to (g2-9) and groups (g3-1) to (g3-9).

R, L, n, X and m are as defined above.

Z is a (j+g) valent linking group.

Z may be any group which does not impair the effects of the present invention and may, for example, be an alkylene group which may have an etheric oxygen atom or a bivalent organopolysiloxane residue, a carbon atom, a nitrogen atom, a silicon atom, a bivalent to octavalent organopolysiloxane residue, or the after described groups (g2-1) to (g2-9) and groups (g3-1) to (g3-9).

j is an integer of at least 1, and in that the water/oil repellent layer will be more excellent in water/oil repellency, preferably an integer of from 1 to 5, and in that the compound (3) will readily be produced, particularly preferably 1.

g is an integer of at least 1, and in that the water/oil repellent layer will be more excellent in abrasion resistance, preferably an integer of from 2 to 4, more preferably 2 or 3, particularly preferably 3.

The compound (3) is, in that the water/oil repellent layer will be more excellent in initial water contact angle and abrasion resistance, preferably compound (3-1), (3-2) or (3-3). Among them, with the compounds (3-1) and (3-2), the water/oil repellent layer will be particularly excellent in initial water contact angle, and with the compound (3-3), the water/oil repellent layer will be particularly excellent in abrasion resistance.

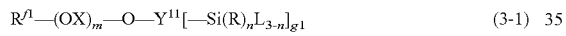

$$R^{f1}-(OX)_m-O-Y^{11}[-Si(R)_nL_{3-n}]_{g1} \quad (3\text{-}1)$$

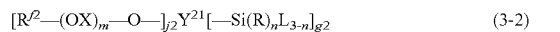

$$[R^{f2}-(OX)_m-O-]_{j2}Y^{21}[-Si(R)_nL_{3-n}]_{g2} \quad (3\text{-}2)$$

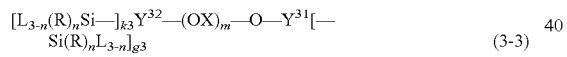

$$[L_{3-n}(R)_nSi-]_{k3}Y^{32}-(OX)_m-O-Y^{31}[-Si(R)_nL_{3-n}]_{g3} \quad (3\text{-}3)$$

In the formula (3-1), X, m, R, n and L are respectively the same as X, m, R, n and L in the formula (3).

$R^{f1}$ is a perfluoroalkyl group, and the preferred embodiments and specific examples of the perfluoroalkyl group are as described above.

$Y^{11}$ is a (g1+1) valent linking group, and its specific examples are the same as Z in the formula (3).

g1 is an integer of at least 2, and in that the water/oil repellent layer will be more excellent in abrasion resistance, preferably an integer of from 2 to 15, more preferably an integer of from 2 to 4, further preferably 2 or 3, particularly preferably 3.

In the formula (3-2), X, m, R, n and L are respectively the same as X, m, R, n and L in the formula (3).

$R^{f2}$ is a perfluoroalkyl group, and the preferred embodiments and specific examples of the perfluoroalkyl group are as described above.

j2 is an integer of at least 2, preferably an integer of from 2 to 6, more preferably an integer of from 2 to 4.

$Y^{21}$ is a (j2+g2) valent linking group, and its specific examples are the same as Z in the formula (3).

g2 is an integer of at least 2, and in that the water/oil repellent layer will be more excellent in abrasion resistance, preferably an integer of from 2 to 15, more preferably from 2 to 6, further preferably from 2 to 4, particularly preferably 4.

In the formula (3-3), X, m, R, n and L are respectively the same as X, m, R, n and L in the formula (3).

k3 is an integer of at least 1, preferably an integer of from 1 to 4, more preferably 2 or 3, particularly preferably 3.

$Y^{32}$ is a (k3+1) valent linking group, and its specific examples are the same as Q in the formula (3).

$Y^{31}$ is a (g3+1) valent linking group, and its specific examples are the same as Z in the formula (3).

g3 is an integer of at least 1, preferably an integer of from 1 to 4, more preferably 2 or 3, particularly preferably 3.

$Y^{11}$ in the formula (3-1) may be group (g2-1) (provided that d1+d3=1 (that is, d1 or d3 is 0), g1=d2+d4, d2+d4≥2), group (g2-2) (provided that e1=1, g1=e2, e2≥2), group (g2-3) (provided that g1=2), group (g2-4) (provided that h1=1, g1=h2, h2≥2), group (g2-5) (provided that i1=1, g1=i2, i2≥2), group (g2-7) (provided that g1=i3+1), group (g2-8) (provided that g1=i4, i4≥2), or group (g2-9) (provided that g1=i5, i5≥2). $Y^{21}$ in the formula (3-2) may be group (g2-1) (provided that j2=d1+d3, d1+d3≥2, g2=d2+d4, d2+d4≥2), group (g2-2) (provided that j2=e1, e1=2, g2=e2, e2=2), group (g2-4) (provided that j2=h1, h1≥2, g2=h2, h2≥2) or group (g2-5) (provided that j2=i1, i1=2, g2=i2, i2=2).

Further, $Y^{31}$ and $Y^{32}$ in the formula (3-3) may be independently group (g2-1) (provided that g3=d2+d4, k3=d2+d4), group (g2-2) (provided that g3=e2, k3=e2), group (g2-3) (provided that g3=2, k3=2), group (g2-4) (provided that g3=h2, k3=h2), group (g2-5) (provided that g3=i2, k3=i2), group (g2-6) (provided that g3=1, k3=1), group (g2-7) (provided that g3=i3+1, k3=i3+1), group (g2-8) (provided that g3=i4, k3=i4), or group (g2-9) (provided that g3=i5, k3=i5).

(g2-1)

$$(-A^1-)_{e1}C(R^{e2})_{4-e1-e2}(-Q^{22}-)_{e2} \quad (g2\text{-}2)$$

$$-A^1-N(-Q^{23}-)_2 \quad (g2\text{-}3)$$

$$(-A^1-)_{h1}Z^1(-Q^{24}-)_{h2} \quad (g2\text{-}4)$$

$$(-A^1-)_{i1}Si(R^{e3})_{4-i1-i2}(-Q^{25}-)_{i2} \quad (g2\text{-}5)$$

$$-A^1-Q^{26}- \quad (g2\text{-}6)$$

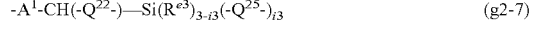

$$-A^1-CH(-Q^{22}-)-Si(R^{e3})_{3-i3}(-Q^{25}-)_{i3} \quad (g2\text{-}7)$$

$$-A^1-[CH_2C(R^{e4})(-Q^{27}-)]_{i4}-R^{e5} \quad (g2\text{-}8)$$

$$-A^1-Z^a(-Q^{28}-)_{i5} \quad (g2\text{-}9)$$

In the formulae (g2-1) to (g2-9), the $A^1$ side is connected to $(OX)_m$, and $Q^{22}$, $Q^{23}$, $Q^{24}$, $Q^{25}$, $Q^{26}$, $Q^{27}$ or $Q^{28}$ side is connected to $[-Si(R)_nL_{3-n}]$.

$A^1$ is a single bond, an alkylene group or an alkylene group having at least 2 carbon atoms and having between carbon-carbon atoms $-C(O)NR^6-$, $-C(O)-$, $-OC(O)O-$, $-NHC(O)O-$, $-NHC(O)NR^6-$, $-O-$ or $-SO_2NR^6-$, and in each formula, when two or more $A^1$ are present, the two or more $A^1$ may be the same or different. The hydrogen atom in the alkylene group may be substituted by a fluorine atom.

$Q^{22}$ is an alkylene group, an alkylene group having at least 2 carbon atoms and having between carbon-carbon atoms —C(O)NR$^6$—, —C(O)—, —NR$^6$— or —O—, an alkylene group having —C(O)NR$^6$—, —C(O)—, —NR$^6$— or —O— at the terminal on the side not connected to Si, or an alkylene group having at least 2 carbon atoms and having between carbon-carbon atoms —C(O)NR$^6$—, —C(O)—, —NR$^6$— or —O— and having —C(O)NR$^6$—, —C(O)—, —NR$^6$— or —O— at the terminal on the side not connected to Si, and in each formula, when two or more $Q^{22}$ are present, the two or more $Q^{22}$ may be the same or different.

$Q^{23}$ is an alkylene group, or an alkylene group having at least 2 carbon atoms and having between carbon-carbon atoms —C(O)NR$^6$—, —C(O)—, —NR— or —O—, and the two $Q^{23}$ may be the same or different.

$Q^{24}$ is $Q^{22}$ when the atom in $Z^1$ to which $Q^{24}$ is bonded is a carbon atom, $Q^{23}$ when the atom in $Z^1$ to which $Q^{24}$ is bonded is a nitrogen atom, and in each formula, when two or more $Q^{24}$ are present, the two or more $Q^{24}$ may be the same or different.

$Q^{25}$ is an alkylene group, or an alkylene group having at least 2 carbon atoms and having between carbon-carbon atoms —C(O)NR$^6$—, —C(O)—, —NR$^6$— or —O—, and in each formula, when two or more $Q^{25}$ are present, the two or more $Q^{25}$ may be the same or different.

$Q^{26}$ is an alkylene group, or an alkylene group having at least 2 carbon atoms and having between carbon-carbon atoms —C(O)NR$^6$—, —C(O)—, —NR$^6$— or —O—.

$R^6$ is a hydrogen atom, a $C_{1-6}$ alkyl group or a phenyl group.

$Q^{27}$ is a single bond or an alkylene group.

$Q^{28}$ is an alkylene group, or an alkylene group having at least 2 carbon atoms and having between carbon-carbon atoms an etheric oxygen atom or a bivalent organopolysiloxane residue.

$Z^1$ is a group having a h1+h2 valent cyclic structure having a carbon atom or a nitrogen atom to which $A^1$ is directly bonded and having a carbon atom or a nitrogen atom to which $Q^{24}$ is directly bonded.

$R^{e1}$ is a hydrogen atom or an alkyl group, and in each formula, when two or more $R^{e1}$ are present, the two or more $R^{e1}$ may be the same or different.

$R^{e2}$ is a hydrogen atom, a hydroxy group, an alkyl group or an acyloxy group. $R^{e3}$ is an alkyl group.

$R^{e4}$ is a hydrogen atom or an alkyl group and in view of easy production of the compound, preferably a hydrogen atom. In each formula, when two or more $R^{e4}$ are present, the two or more $R^{e4}$ may be the same or different.

$R^{e5}$ is a hydrogen atom or a halogen atom, and in view of easy production of the compound, preferably a hydrogen atom.

d1 is an integer of from 0 to 3, preferably 1 or 2. d2 is an integer of from 0 to 3, preferably 1 or 2. d1+d2 is an integer of from 1 to 3.

d3 is an integer of from 0 to 3, and is preferably 0 or 1. d4 is an integer of from 0 to 3, preferably 2 or 3. d3+d4 is an integer of from 1 to 3.

d1+d3 is, in $Y^{11}$ and $Y^{21}$, an integer of from 1 to 5, preferably 1 or 2, and in $Y^{11}Y^{31}$ and $Y^{32}$, 1.

d2+d4 is, in $Y^{11}$ and $Y^{21}$, an integer of from 2 to 5, preferably 4 or 5, and in $Y^{31}$ and $Y^{32}$, an integer of from 3 to 5, preferably 4 or 5.

e1+e2 is 3 or 4. e1 is 1 in $Y^{11}$, an integer of from 2 to 3 in $Y^{21}$, and 1 in $Y^{31}$ and $Y^{32}$. e2 is 2 or 3 in $Y^{11}$ and $Y^{21}$, and 2 or 3 in $Y^{31}$ and $Y^{32}$.

h1 is 1 in $Y^{11}$, an integer of at least 2 (preferably 2) in $Y^{21}$, and 1 in $Y^{31}$ and $Y^{32}$. h2 is an integer of at least 2 (preferably 2 or 3) in $Y^{11}$ and $Y^{21}$, and an integer of at least 1 (preferably 2 or 3) in $Y^{31}$ and $Y^{32}$.

i1+i2 is 3 or 4 in $Y^{11}$, 4 in $Y^{12}$, and 3 or 4 in $Y^{31}$ and $Y^{32}$. i1 is 1 in $Y^{11}$, 2 in $Y^{21}$, and 1 in $Y^{31}$ and $Y^{32}$. i2 is 2 or 3 in $Y^{11}$, 2 in $Y^{12}$, and 2 or 3 in $Y^{31}$ and $Y^{32}$.

i3 is 2 or 3.

i4 is at least 2 (preferably an integer of from 2 to 10, particularly preferably an integer of from 2 to 6) in $Y^{11}$, and at least 1 (preferably an integer of from 1 to 10, particularly preferably an integer of from 1 to 6) in $Y^{31}$ and $Y^{32}$.

i5 is at least 2, preferably an integer of from 2 to 7.

The number of carbon atoms in the alkylene group in $Q^{22}$, $Q^{23}$, $Q^{24}$, $Q^{25}$, $Q^{26}$, $Q^{27}$ and $Q^{28}$ is, in that the compounds (3-1), (3-2) and (3-3) are readily produced and in that the water/oil repellent layer will be more excellent in abrasion resistance, light resistance and chemical resistance, preferably from 1 to 10, more preferably from 1 to 6, particularly preferably from 1 to 4. When the alkylene group has a specific bond between carbon-carbon atoms, the lower limit of the number of carbon atoms in such an alkylene group is 2.

As the cyclic structure in $Z^1$, the above-described cyclic structures may be mentioned, and the preferred embodiments are also the same. Since $A^1$ and $Q^{24}$ are directly bonded to the cyclic structure in $Z^1$, $A^1$ and $Q^{24}$ will not be connected to, for example, an alkylene group connected to the cyclic structure.

$Z^a$ is a (i5+1) valent organopolysiloxane residue, and the following groups are preferred. In the following formulae, $R^a$ is an alkyl group (preferably $C_{1-10}$) or a phenyl group.

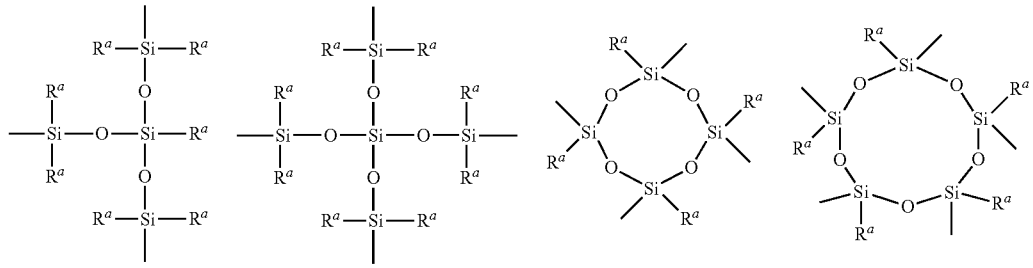

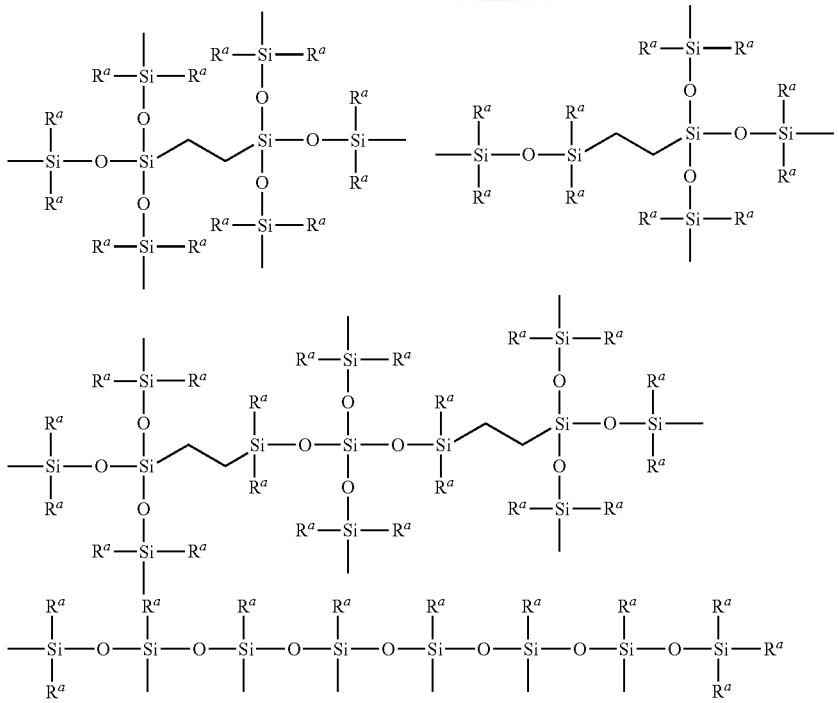

The number of carbon atoms in the alkyl group as $R^{e1}$, $R^{e2}$, $R^{e3}$ and $R^{e4}$ is, in that the compounds (3-1), (3-2) and (3-3) are readily produced, preferably from 1 to 10, more preferably from 1 to 6, further preferably from 1 to 3, particularly preferably from 1 to 2.

The number of carbon atoms in the alkyl group moiety in the acyloxy group as $R^{e2}$ is, in that the compounds (3-1), (3-2) and (3-3) are readily produced, preferably from 1 to 10, more preferably from 1 to 6, further preferably from 1 to 3, particularly preferably from 1 to 2.

h1 is, in that the compounds (3-1), (3-2) and (3-3) are readily produced, and in that the water/oil repellent layer will be more excellent in abrasion resistance and fingerprint stain removability, preferably from 1 to 6, more preferably from 1 to 4, further preferably 1 or 2, particularly preferably 1.

h2 is, in that the compounds (3-1), (3-2) and (3-3) are readily produced, and in that the water/oil repellent layer will be more excellent in abrasion resistance and fingerprint stain removability, preferably from 2 to 6, more preferably from 2 to 4, particularly preferably 2 or 3.

As other embodiment of $Y^{11}$, group (g3-1) (provided that d1+d3=1 (that is, d1 or d3 is 0), g1=d2×r1+d4×r1), group (g3-2) (provided that e1=1, g1=e2×r1), group (g3-3) (provided that g1=2×r1), group (g3-4) (provided that h1=1, g1=h2×r1), group (g3-5) (provided that i1=1, g1=i2×r1), group (g3-6) (provided that g1=r1), group (g3-7) (provided that g1=r1×(i3+1)), group (g3-8) (provided that g1=r1×i4), or group (g3-9) (provided that g1=r1×i5) may be mentioned.

As other embodiment of $Y^{21}$, group (g3-1) (provided that j2=d1+d3, d1+d3≥2, g2=d2×r1+d4×r1), group (g3-2) (provided that j2=e1, e1=2, g2=e2×r1, e2=2), group (g3-4) (provided that j2=h1, h12, g2=h2×r1), or group (g3-5) (provided that j2=i1, i1 is 2 or 3, g2=i2×r1, i1+i2 is 3 or 4) may be mentioned.

As other embodiment of $Y^{31}$ and $Y^{32}$, group (g3-1) (provided that g3=d2×r1+d4×r1, k3=d2×r1+d4×r1), group (g3-2) (provided that g3=e2×r1, k3=e2×r1), group (g3-3) (provided that g3=2×r1, k3=2×r1), group (g3-4) (provided that g3=h2×r1, k3=h2×r1), group (g3-5) (provided that g3=i2×r1, k3=i2×r1), group (g3-6) (provided that g3=r1, k3=r1), group (g3-7) (provided that g3=r1×(i3+1), k3=r1×(i3+1)), group (g3-8) (provided that g3=r1×i4, k3=r1×i4), or group (g3-9) (provided that g3=r1×i5, k3=r1×i5) may be mentioned.

(g3-1)

(g3-2)

(g3-3)

(g3-4)

(g3-5)

(g3-6)

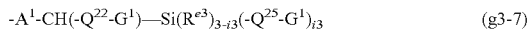

(g3-7)

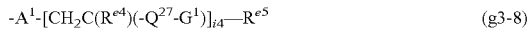

(g3-8)

(g3-9)

In the formulae (g3-1) to (g3-9), the $A^1$ side is connected to $(OX)_m$, and the $G^1$ side is connected to $[-Si(R)_nL_{3-n}]$.

$G^1$ is group (g3), and in each formula, when two or more $G^1$ are present, the two or more $G^1$ may be the same or different. Symbols other than $G^1$ are the same as symbols in the formulae (g2-1) to (g2-9).

$$—Si(R^8)_{3-r1}(-Q^3-)_{r1} \quad (g3)$$

In the formula (g3), the Si side is connected to $Q^{22}$, $Q^{23}$, $Q^{24}$, $Q^{25}$, $Q^{26}$, $Q^{27}$ or $Q^{28}$, and the $Q^3$ side is connected to $[—Si(R)_nL_{3-n}]$. $R^8$ is an alkyl group. $Q^3$ is an alkylene group, or an alkylene group having at least 2 carbon atoms and having between carbon-carbon atoms —C(O)NR$^6$—, —C(O)—, —NR$^6$— or —O—, or —(OSi(R$^9$)$_2$)$_p$—O—, and two or more $Q^3$ may be the same or different. r1 is 2 or 3. $R^6$ is a hydrogen atom, or a $C_{1-6}$ alkyl group, or a phenyl group. $R^9$ is an alkyl group, a phenyl group or an alkoxy group, and two $R^9$ may be the same or different. p is an integer of from 0 to 5, and when p is at least 2, the two or more (OSi(R$^9$)$_2$) may be the same or different.

The number of carbon atoms in the alkylene group as $Q^3$ is, in that the compounds (3-1), (3-2) and (3-3) are readily produced and in that the water/oil repellent layer will be more excellent in abrasion resistance, light resistance and chemical resistance, preferably from 1 to 10, more preferably from 1 to 6, particularly preferably from 1 to 4. When the alkylene group has a specific bond between carbon-carbon atoms, the lower limit of the number of carbon atoms in such an alkylene group is 2.

The number of carbon atoms in the alkyl group as $R^8$ is, in that the compounds (3-1), (3-2) and (3-3) are readily produced, preferably from 1 to 10, more preferably from 1 to 6, further preferably from 1 to 3, particularly preferably from 1 to 2.

The number of carbon atoms in the alkyl group as $R^9$ is, in that the compounds (3-1), (3-2) and (3-3) are readily produced, preferably from 1 to 10, more preferably from 1 to 6, further preferably from 1 to 3, particularly preferably from 1 to 2.

The number of carbon atoms in the alkoxy group as $R^9$ is, in that the compounds (3-1), (3-2) and (3-3) are excellent in storage stability, preferably from 1 to 10, more preferably from 1 to 6, further preferably from 1 to 3, particularly preferably from 1 to 2.

p is preferably 0 or 1.

As the compounds (3-1), (3-2) and (3-3), for example, the following compounds may be mentioned. The following compounds are industrially readily produced, are easily handled, and provide a water/oil repellent layer excellent in water/oil repellency, abrasion resistance, fingerprint stain removability, lubricity, chemical resistance, light resistance and chemical resistance, particularly light resistance. In the following compounds, $R^f$ is the same as that in $R^{f1}$—(OX)$_m$—O— in the formula (3-1) or $R^{f2}$—(OX)$_m$—O— in the formula (3-2), and the preferred embodiments are also the same. In the following compounds, $Q^f$ is the same as that in —(OX)$_m$—O— in the formula (3-3), and the preferred embodiments are also the same.

As the compound (3-1) wherein $Y^{11}$ is group (g2-1), the following compound may, for example, be mentioned.

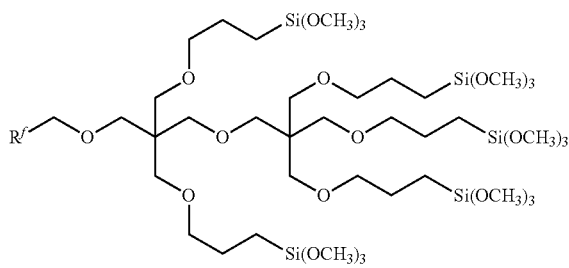

As the compound (3-1) wherein $Y^{11}$ is group (g2-2), the following compounds may, for example, be mentioned.

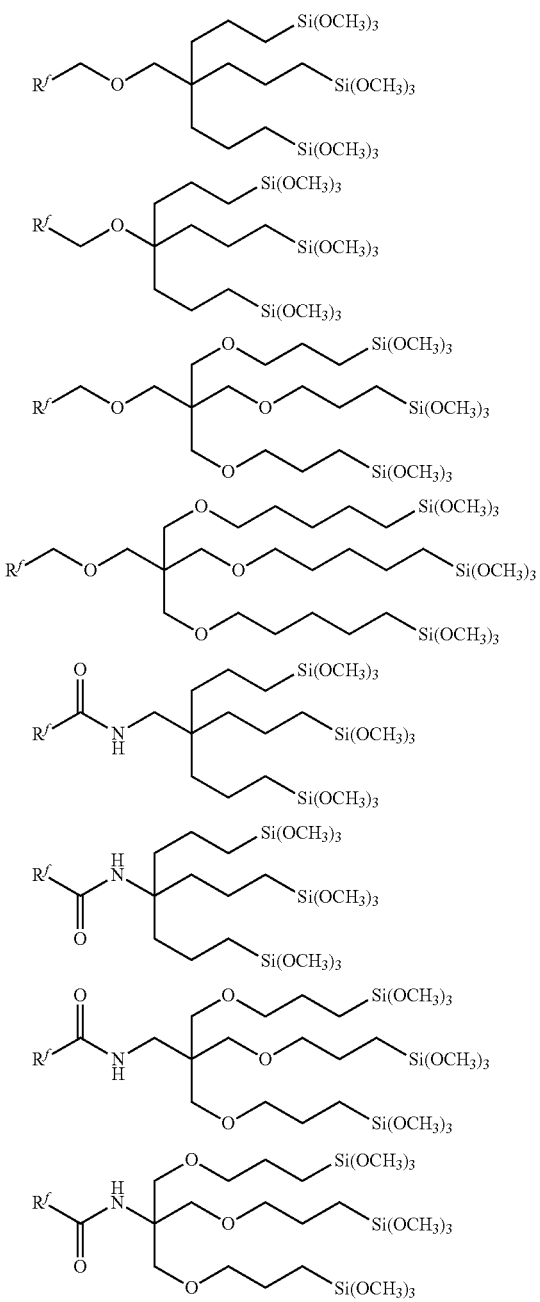

-continued
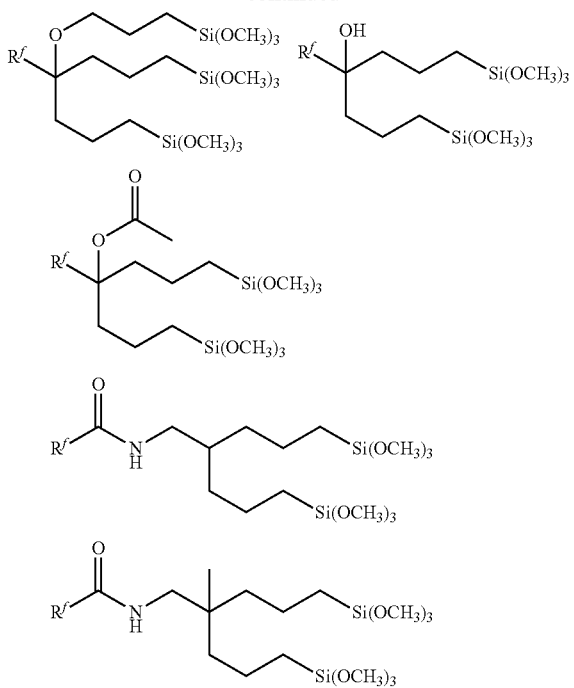
As the compound (3-2) wherein $Y^{21}$ is group (g2-2), the following compounds may, for example, be mentioned.
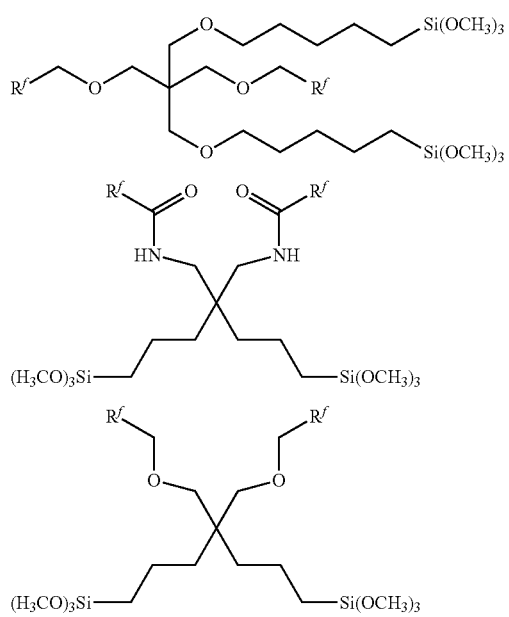
As the compound (3-1) wherein $Y^{11}$ is group (g2-3), the following compounds may, for example, be mentioned.
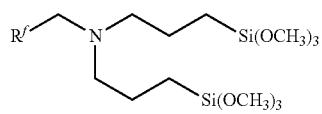
-continued
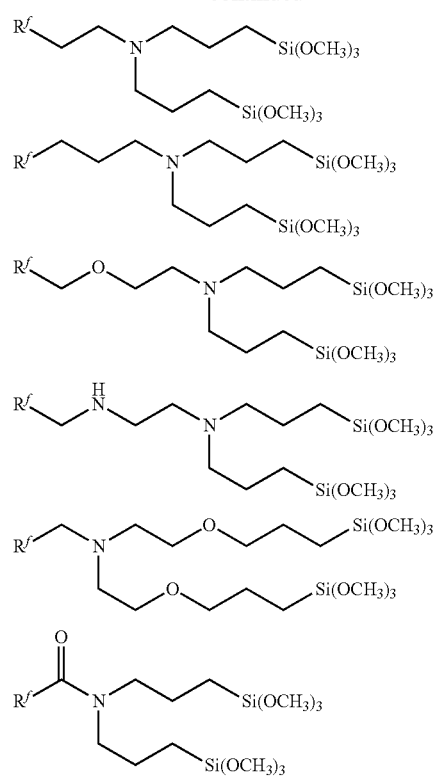
As the compound (3-1) wherein $Y^{11}$ is group (g2-4), the following compounds may, for example, be mentioned.
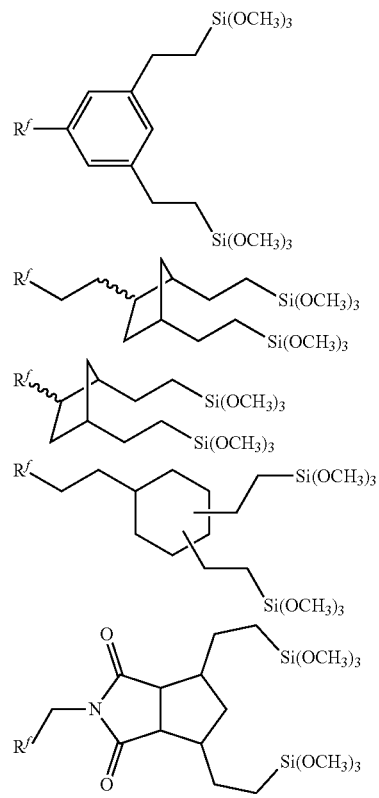

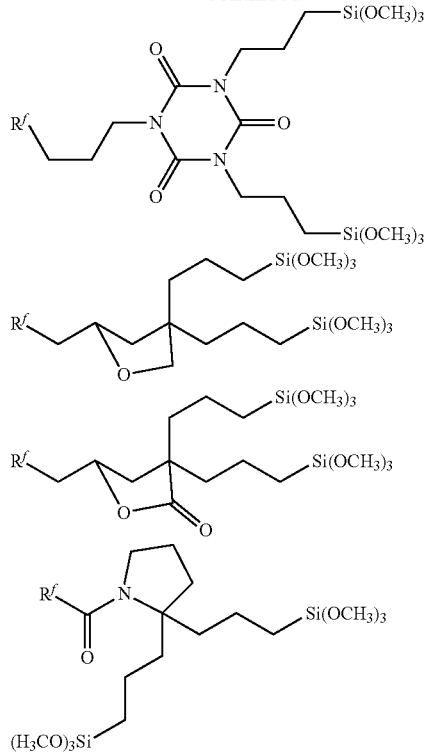
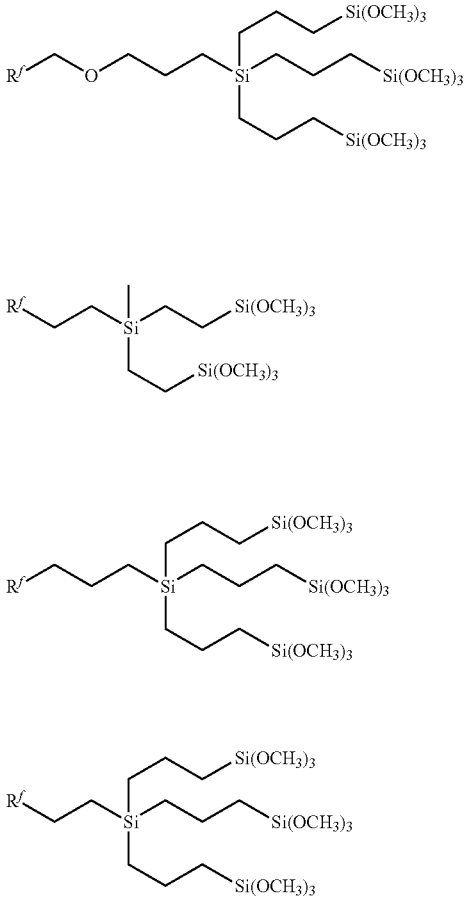
As the compound (3-1) wherein $Y^{11}$ is group (g2-5), the following compounds may, for example, be mentioned.
As the compound (3-1) wherein $Y^{11}$ is group (g2-7), the following compounds may, for example, be mentioned.
As the compound (3-1) wherein $Y^{11}$ is group (g3-1), the following compounds may, for example, be mentioned.

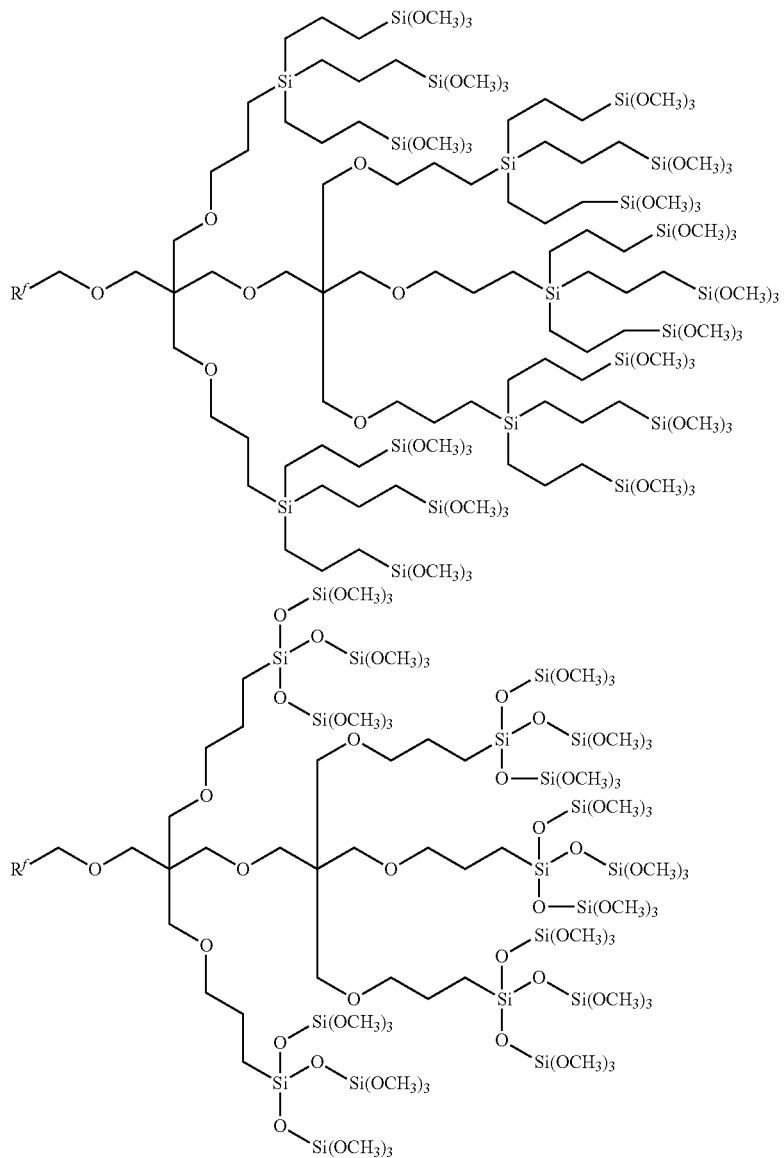
As the compound (3-1) wherein $Y^{11}$ is group (g3-2), the following compounds may, for example, be mentioned.
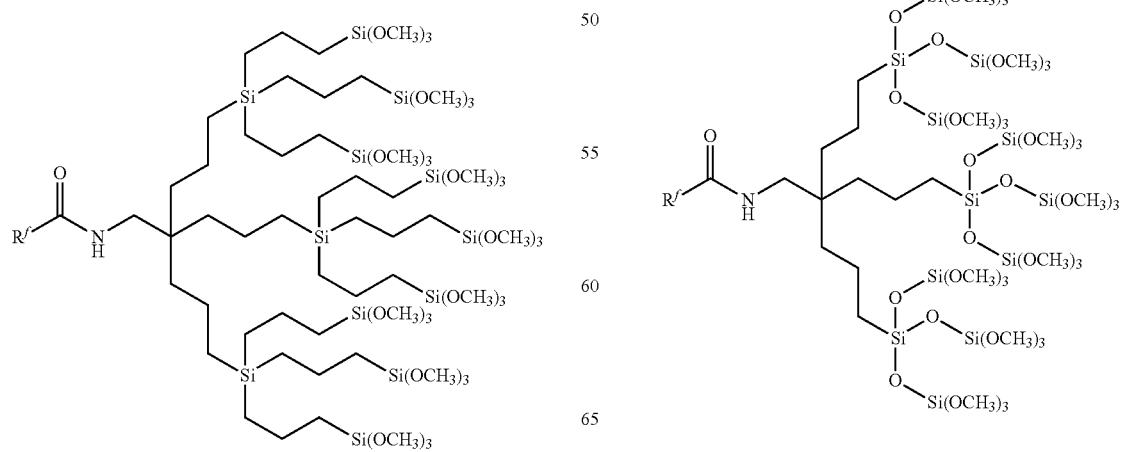

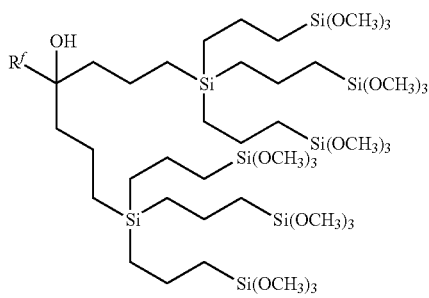
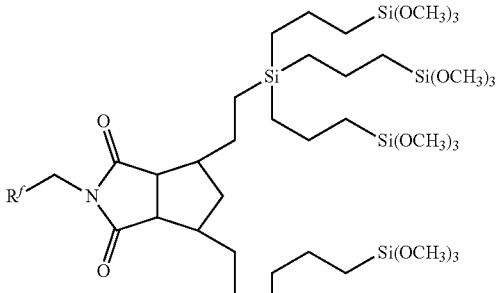
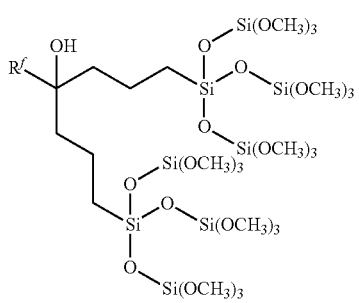
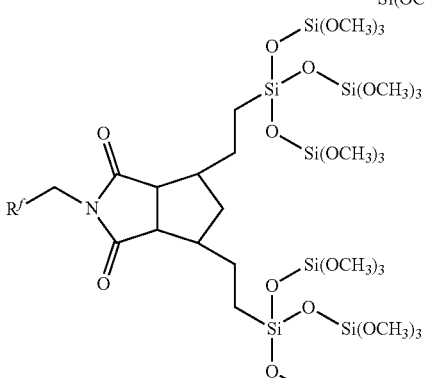
As the compound (3-1) wherein $Y^{11}$ is group (g3-3), the following compounds may, for example, be mentioned.
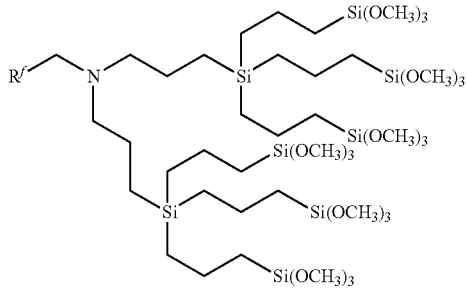
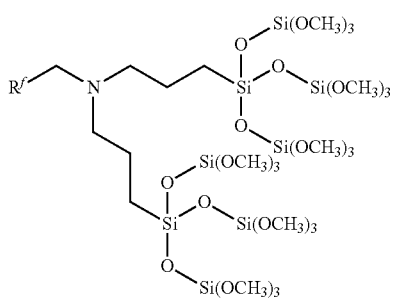
As the compound (3-1) wherein $Y^{11}$ is group (g3-4), the following compounds may, for example, be mentioned.
As the compound (3-1) wherein $Y^{11}$ is group (g3-5), the following compounds may, for example, be mentioned.

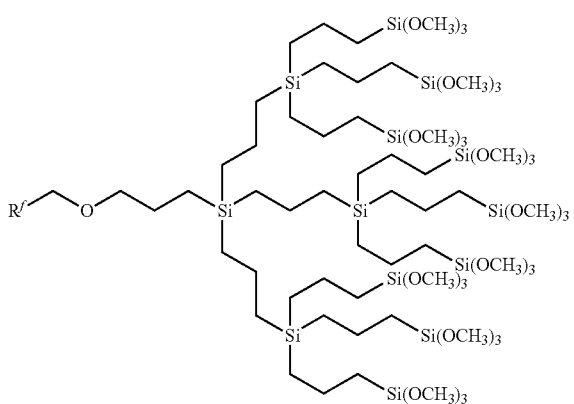

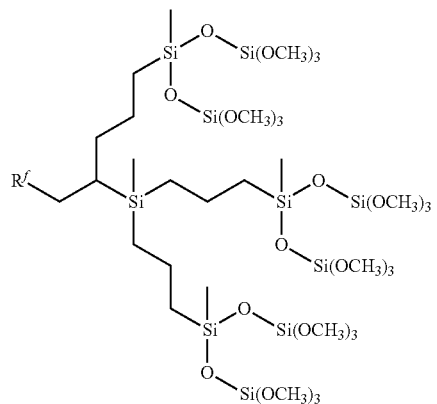

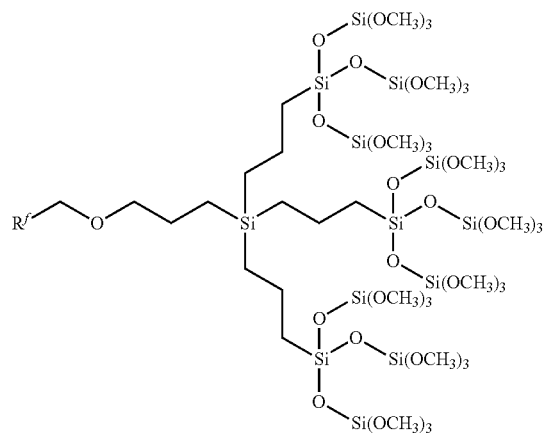

As the compound (3-1) wherein $Y^{11}$ is group (g3-6), the following compounds may, for example, be mentioned.

As the compound (3-2) wherein $Y^{21}$ is group (g2-1), the following compounds may, for example, be mentioned.

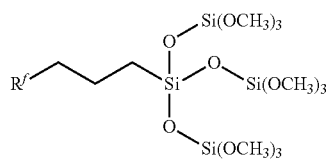

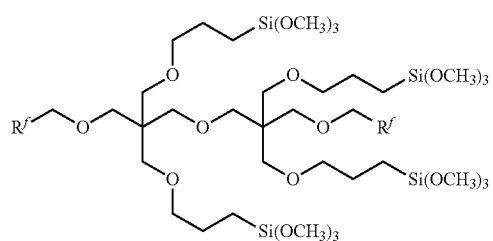

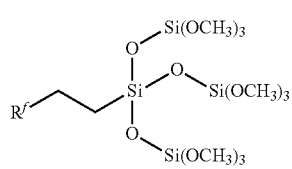

As the compound (3-1) wherein $Y^{11}$ is group (g3-7), the following compounds may, for example, be mentioned.

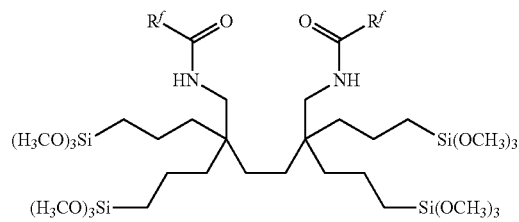

As the compound (3-3) wherein $Y^{31}$ and $Y^{32}$ are group (g2-1), the following compound may, for example, be mentioned.

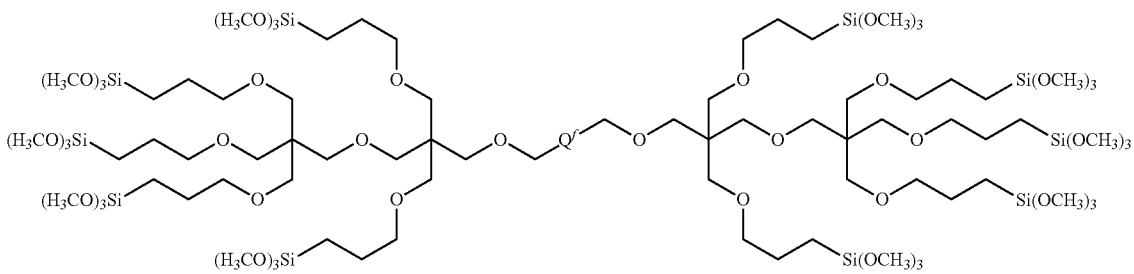
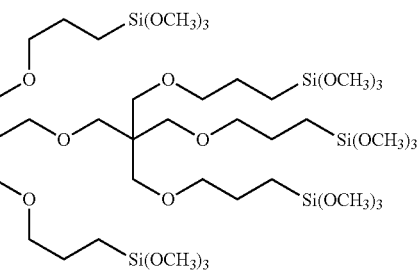

As the compound (3-3) wherein $Y^{31}$ and $Y^{32}$ are group (g2-2), the following compounds may, for example, be mentioned.

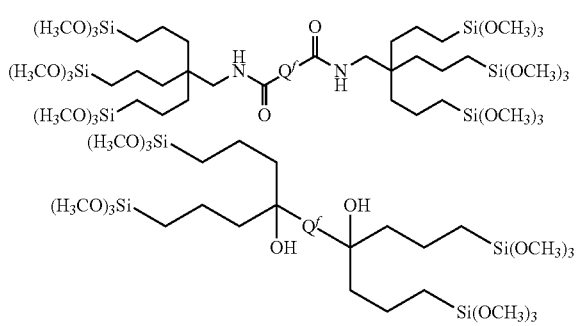

As the compound (3-3) wherein $Y^{31}$ and $Y^{32}$ are group (g2-3), the following compound may, for example, be mentioned.

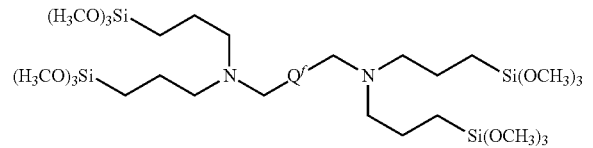

As the compound (3-3) wherein $Y^{31}$ and $Y^{32}$ are group (g2-4), the following compound may, for example, be mentioned.

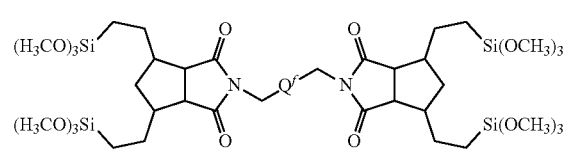

As the compound (3-3) wherein $Y^{31}$ and $Y^{32}$ are group (g2-5), the following compound may, for example, be mentioned.

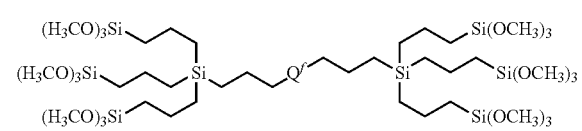

As the compound (3-3) wherein $Y^{31}$ and $Y^{32}$ are group (g2-6), the following compound may, for example, be mentioned.

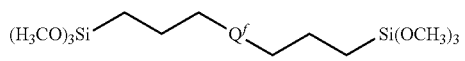

As the compound (3-3) wherein $Y^{31}$ and $Y^{32}$ are group (g2-7), the following compound may, for example, be mentioned.

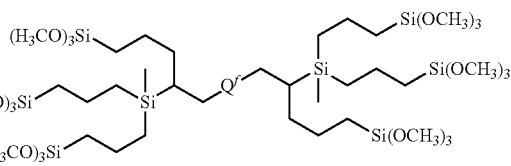

As the compound (3-3) wherein $Y^{31}$ and $Y^{32}$ are group (g3-2), the following compounds may, for example, be mentioned.

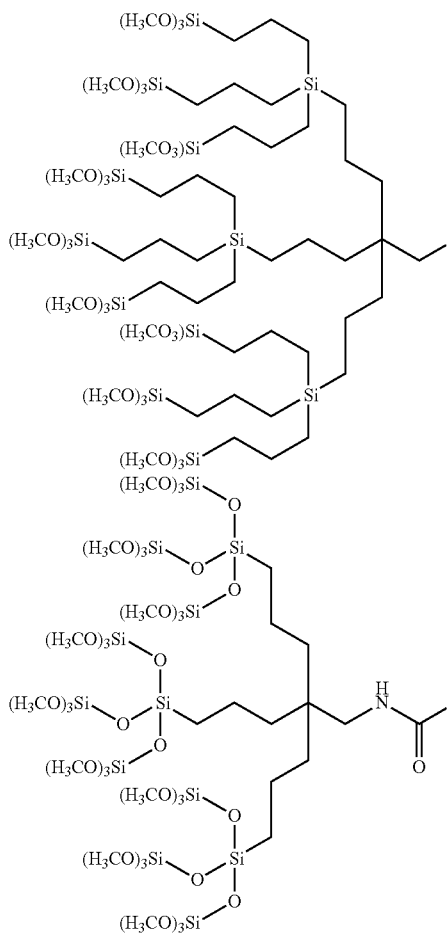
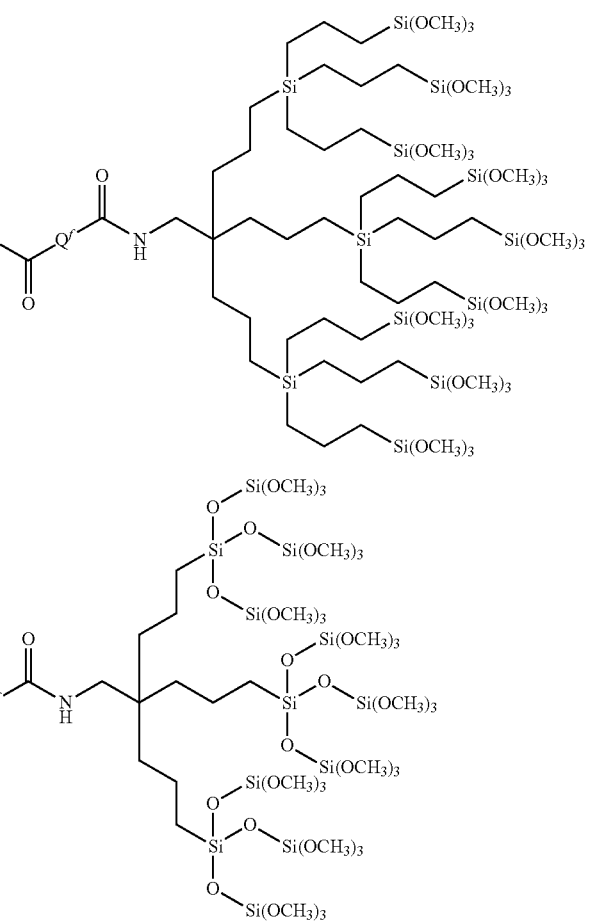

As the fluorinated ether compound, in that the film will be more excellent in water/oil repellency and abrasion resistance, compound represented by the formula (3X) is also preferred.

$$[A\text{-}(OX)_m]_j Z'[\text{—}Si(R)_n L_{3-n}]_g \qquad (3X)$$

The compound (3X) is, in that the film will be more excellent in water/oil repellency, preferably a compound represented by the formula (3-1).

$$A\text{-}(OX)_m\text{—}Z^{31} \qquad (3\text{-}1)$$

In the formula (3-1), A, X and m are as defined for the respective groups in the formula (3).

Z' is a (j+g) valent linking group.

Z' is any group which does not impair the effects of the present invention and may, for example, be an alkylene group which may have an etheric oxygen atom or a bivalent organopolysiloxane residue, an oxygen atom, a carbon atom, a nitrogen atom, a silicon atom, a bivalent to octavalent organopolysiloxane residue, or a group having $Si(R)_n L_{3-n}$ removed from the formulae (3-1A), (3-1B) and (3-1A-1) to (3-1A-6).

$Z^{31}$ is group (3-1A) or group (3-1B).

$$\text{-}Q^a\text{-}X^{31}(\text{-}Q^b\text{-}Si(R)_n L_{3-n})_h(\text{—}R^{31})_i \qquad (3\text{-}1A)$$

$$\text{-}Q^c\text{-}[CH_2C(R^{32})(\text{-}Q^d\text{-}Si(R)_n L_{3-n})]_y\text{—}R^{33} \qquad (3\text{-}1B)$$

$Q^a$ is a single bond or a bivalent linking group.

The bivalent linking group may, for example, be a bivalent hydrocarbon group, a bivalent heterocyclic group, —O—, —S—, —SO$_2$—, —N(R$^d$)—, —C(O)—, —Si(R$^a$)$_2$— or a group having two or more of them combined. R$^a$ is an alkyl group (preferably C$_{1-10}$) or a phenyl group. R$^d$ is a hydrogen atom or an alkyl group (preferably C$_{1-10}$).

The bivalent hydrocarbon group may be a bivalent saturated hydrocarbon group, a bivalent aromatic hydrocarbon group, an alkenylene group or an alkynylene group. The bivalent saturate hydrocarbon group may be linear, branched or cyclic, and may, for example, be an alkylene group. The number of carbon atoms in the bivalent saturated hydrocarbon group is preferably from 1 to 20. Further, the bivalent aromatic hydrocarbon group preferably has from 5 to 20 carbon atoms and may, for example, be a phenylene group. The alkenylene group is preferably a C$_{2-20}$ alkenylene group, and the alkynylene group is preferably a C$_{2-20}$ alkynylene group.

The group having two or more of them combined may, for example, be —OC(O)—, —C(O)N(R$^d$)—, an alkylene group having an etheric oxygen atom, an alkylene group having —OC(O)—, or alkylene group-Si(R$^a$)$_2$-phenylene group-Si(R$^a$)$_2$.

$X^{31}$ is a singe bond, an alkylene group, a carbon atom, a nitrogen atom, a silicon atom or a bivalent to octavalent organopolysiloxane residue.

The alkylene group may have —O—, a silphenylene skeleton group, a bivalent organopolysiloxane residue or a dialkylsilylene group. The alkylene group may have a plurality of groups selected from the group consisting of —O—, a silphenylene skeleton group, a bivalent organopolysiloxane residue and a dialkylsilylene group.

The number of carbon atoms in the alkylene group represented by $X^{31}$ is preferably from 1 to 20, particularly preferably from 1 to 10.

The bivalent to octavalent organopolysiloxane residue may be a bivalent organopolysiloxane residue or the after described (w+1) valent organopolysiloxane residue.

$Q^b$ is a singe bond or a bivalent linking group.

The bivalent linking group is as defined for the above $Q^a$.

$R^{31}$ is a hydroxy group or an alkyl group.

The number of carbon atoms in the alkyl group is preferably from 1 to 5, more preferably from 1 to 3, particularly preferably 1.

When $X^{31}$ is a singe bond or an alkylene group, h is 1, and i is 0, when $X^{31}$ is a nitrogen atom, h is an integer of from 1 to 2, i is an integer of from 0 to 1, and h+i=2 is satisfied, when $X^{31}$ is a carbon atom or a silicon atom, h is an integer of from 1 to 3, i is an integer of from 0 to 2, and h+i=3 is satisfied, and when $X^{31}$ is a bivalent to octavalent organopolysiloxane residue, h is an integer of from 1 to 7, i is an integer of from 0 to 6, and h+i=1 to 7 is satisfied.

When there are two or more $(-Q^b-Si(R)_nL_{3-n})$, the two or more $(-Q^b-Si(R)_nL_{3-n})$ may be the same or different. When there are two or more $R^{31}$, the two or more $(-R^{31})$ may be the same or different.

$Q^c$ is a singe bond, or an alkylene group which may have an etheric oxygen atom, and in view of easy production of the compound, preferably a single bond.

The number of carbon atoms in the alkylene group which may have an etheric oxygen atom is preferably from 1 to 10, particularly preferably from 2 to 6.

$R^{32}$ is a hydrogen atom or a $C_{1-10}$ alkyl group, and in view of easy production of the compound, preferably a hydrogen atom.

The alkyl group is preferably a methyl group.

$Q^d$ is a single bond or an alkylene group. The number of carbon atoms in the alkylene group is preferably from 1 to 10, particularly preferably from 1 to 6. In view of easy production of the compound, $Q^d$ is preferably a single bond or —CH$_2$—.

$R^{33}$ is a hydrogen atom or a halogen atom, and in view of easy production of the compound, preferably a hydrogen atom.

y is an integer of from 1 to 10, preferably an integer of from 1 to 6.

The two or more[CH$_2$C(R$^{32}$)(Q$^d$-Si(R)$_n$L$_{3-n}$)] may be the same or different.

As the group (3-1A), groups (3-1A-1) to (3-1A-6) are preferred.

—(X$^{32}$)$_{s1}$-Q$^{b1}$-SiR$_n$L$_{3-n}$ (3-1A-1)

—(X$^{33}$)$_{s2}$-Q$^{a2}$-N[-Q$^{b2}$-Si(R)$_{n3}$L$_{3-n}$]$_2$ (3-1A-2)

-Q$^{a3}$-G(R$^g$)[-Q$^{b3}$-Si(R)$_n$L$_{3-n}$]$_2$ (3-1A-3)

—[C(O)N(R$^d$)]$_{s4}$-Q$^{a4}$-(O)$_{t4}$—C[—(O)$_{u4}$-Q$^{b4}$-Si(R)$_n$L$_{3-n}$]$_3$ (3-1A-4)

-Q$^{a5}$-Si[-Q$^5$-Si(R)$_n$L$_{3-n}$]$_3$ (3-1A-5)

—[C(O)N(R$^d$)]$_v$-Q$^{a6}$-Z$^{a'}$[-Q$^{b6}$-Si(R)$_n$L$_{3-n}$]$_w$ (3-1A-6)

In the formulae (3-1A-1) to (3-1A-6), R, L, and n are as defined above.

$X^{32}$ is —O— or —C(O)N(R$^d$)— (provided that N in the formula is bonded to $Q^{b1}$)

$R^d$ is as defined above.

s1 is 0 or 1.

$Q^{b1}$ is an alkylene group. The alkylene group may have —O—, a silphenylene skeleton group, a bivalent organopolysiloxane residue or a dialkylsilylene group. The alkylene group may have a plurality of groups selected from the group consisting of —O—, a silphenylene skeleton group, a bivalent organopolysiloxane residue and a dialkylsilylene group.

When the alkylene group has —O—, a silphenylene skeleton group, a bivalent organopolysiloxane residue or a dialkylsilylene group, the alkylene group preferably has such a group between carbon atom-carbon atom.

The number of carbon atoms in the alkylene group represented by $Q^{b1}$ is preferably from 1 to 10, particularly preferably from 2 to 6.

$Q^{b1}$ is, when s1 is 0, preferably —CH$_2$OCH$_2$CH$_2$CH$_2$—, —CH$_2$OCH$_2$CH$_2$OCH$_2$CH$_2$CH$_2$—, —CH$_2$CH$_2$—, —CH$_2$CH$_2$CH$_2$—, or —CH$_2$OCH$_2$CH$_2$CH$_2$Si(CH$_3$)$_2$OSi(CH$_3$)$_2$CH$_2$CH$_2$—. When (X$^{32}$)$_{s1}$ is —O—, it is preferably —CH$_2$CH$_2$CH$_2$—, or —CH$_2$CH$_2$OCH$_2$CH$_2$CH$_2$—. When (X$^{32}$)$_{s1}$ is —C(O)N(R$^d$)—, it is preferably a C$_{2-6}$ alkylene group (provided that N in the formula is bonded to $Q^{b1}$). When $Q^{b1}$ is such a group, the compound will readily be produced.

As specific examples of the group (3-1A-1), the following groups may be mentioned. In the following formulae, * represents the position of bonding to (OX)$_m$.

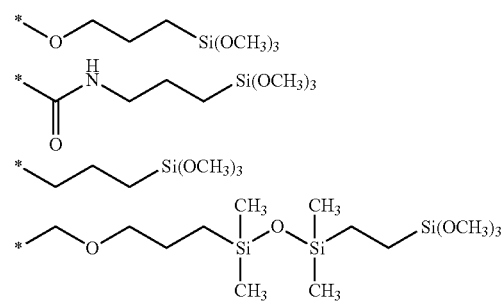

$X^{33}$ is —O—, —NH— or —C(O)N(R$^d$)—.

$R^d$ is as defined above.

$Q^{a2}$ is a single bond, an alkylene group, —C(O)— or an alkylene group having at least 2 carbon atoms and having between carbon atom-carbon atom an etheric oxygen atom, —C(O)—, —C(O)O—, —OC(O)— or —NH—.

The number of carbon atoms in the alkylene group represented by $Q^{a2}$ is preferably from 1 to 10, particularly preferably from 1 to 6.

The number of carbon atoms in the alkylene group having at least 2 carbon atoms and having between carbon atom-carbon atom an etheric oxygen atom, —C(O)—, —C(O)O—, —OC(O)— or —NH—, represented by $Q^{a2}$, is preferably from 2 to 10, particularly preferably from 2 to 6.

$Q^{a2}$ is, in that the compound will readily be produced, preferably —CH$_2$—, —CH$_2$CH$_2$—, —CH$_2$CH$_2$CH$_2$—, —CH$_2$OCH$_2$CH$_2$—, —CH$_2$NHCH$_2$CH$_2$—, —CH$_2$CH$_2$OC(O)CH$_2$CH$_2$—, or —C(O)— (provided that the right side is bonded to N).

s2 is 0 or 1 (provided that when $Q^{a2}$ is a singe bond, it is 0). It is preferably 0 in that the compound will readily be produced.

$Q^{b2}$ is an alkylene group or an alkylene group having at least 2 carbon atoms and having between carbon atom-carbon atom a bivalent organopolysiloxane residue, an etheric oxygen atom or —NH—.

The number of carbon atoms in the alkylene group represented by $Q^{b2}$ is preferably from 1 to 10, particularly preferably from 2 to 6.

The number of carbon atoms in the alkylene group having at least 2 carbon atoms and having between carbon atom-carbon atom a bivalent organopolysiloxane residue, an etheric oxygen atom or —NH—, represented by $Q^{b2}$, is preferably from 2 to 10, particularly preferably from 2 to 6.

$Q^{b2}$ is, in that the compound will readily be produced, preferably —CH$_2$CH$_2$CH$_2$—, or —CH$_2$CH$_2$OCH$_2$CH$_2$CH$_2$— (provided that the right side id bonded to Si).

The two [-$Q^{b2}$-Si(R)$_n$L$_{3-n}$] may be the same or different.

As specific examples of the group (3-1A-2), the following groups may be mentioned. In the following formulae, * represents the position of bonding to (OX)$_m$.

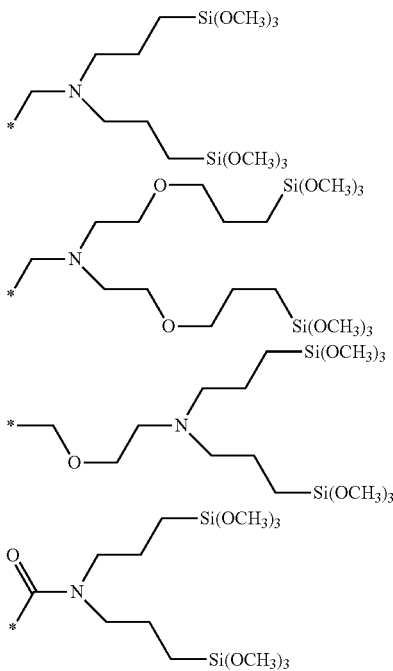

$Q^{a3}$ is a single bond or an alkylene group which may have an etheric oxygen atom, and in that the compound will readily be produced, preferably a single bond.

The number of carbon atoms in the alkylene group which may have an etheric oxygen atom is preferably from 1 to 10, particularly preferably from 2 to 6.

G is a carbon atom or a silicon atom.

R$^g$ is a hydroxy group or an alkyl group. The number of carbon atoms in the alkyl group represented by R$^g$ is preferably from 1 to 4.

G(R$^g$) is, in that the compound will readily be produced, preferably C(OH) or Si(R$^{ga}$) (provided that R$^{ga}$ is an alkyl group, preferably having from 1 to 10 carbon atoms, and is particularly preferably a methyl group).

$Q^{b3}$ is an alkylene group or an alkylene group having at least 2 carbon atoms and having between carbon atom-carbon atom an etheric oxygen atom or a bivalent organopolysiloxane residue.

The number of carbon atoms in the alkylene group represented by $Q^{b3}$ is preferably from 1 to 10, particularly preferably from 2 to 6.

The number of carbon atoms in the alkylene group having at least 2 carbon atoms and having between carbon atom-carbon atom an etheric oxygen atom or a bivalent organopolysiloxane residue, represented by $Q^{b3}$, is preferably from 2 to 10, particularly preferably from 2 to 6.

$Q^{b3}$ is, in that the compound will readily be produced, preferably —CH$_2$CH$_2$—, —CH$_2$CH$_2$CH$_2$—, or —CH$_2$CH$_2$CH$_2$CH$_2$CH$_2$CH$_2$CH$_2$CH$_2$—.

The two [-$Q^{b3}$-Si(R)$_n$L$_{3-n}$] may be the same or different.

As specific examples of the group (3-1A-3), the following groups may be mentioned. In the following formulae, * represents the position of bonding to (OX)$_m$.

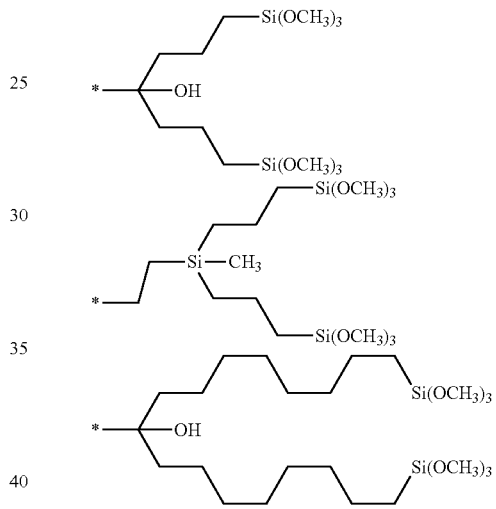

R$^d$ in the formula (3-1A-4) is as defined above.

s4 is 0 or 1.

$Q^{a4}$ is a single bond or an alkylene group which may have an etheric oxygen atom.

The number of carbon atoms in the alkylene group which may have an etheric oxygen atom is preferably from 1 to 10, particularly preferably from 2 to 6. t4 is 0 or 1 (provided that when $Q^{a4}$ is a singe bond, it is 0).

-$Q^{a4}$—(O)$_{t4}$ is, in that the compound will readily be produced, when s4 is 0, preferably a single bond, —CH$_2$O—, —CH$_2$OCH$_2$—, —CH$_2$OCH$_2$CH$_2$O—, —CH$_2$OCH$_2$CH$_2$OCH$_2$—, or —CH$_2$OCH$_2$CH$_2$CH$_2$CH$_2$OCH$_2$— (provided that the left side is bonded to (OX)$_m$), and when s4 is 1, it is preferably a single bond, —CH$_2$—, or —CH$_2$CH$_2$—.

$Q^{b4}$ is an alkylene group, and the alkylene group may have —O—, —C(O)N(R$^d$)— (R$^d$ is as defined above), a silphenylene skeleton group, a bivalent organopolysiloxane residue or a dialkylsilylene group.

In a case where the alkylene group has —O— or a silphenylene skeleton group, the alkylene group preferably has —O— or a silphenylene skeleton group between carbon atom-carbon atom. Further, in a case where the alkylene group has —C(O)N(R$^d$)—, a dialkylsilylene group or a bivalent organopolysiloxane residue, the alkylene group preferably has such a group between carbon atom-carbon atom or at the terminal on the side bonded to $(O)_u4$.

The number of carbon atoms in the alkylene group represented by $Q^{b4}$ is preferably from 1 to 10, particularly preferably from 2 to 6.

u4 is 0 or 1.

—$(O)_{u4}$-$Q^{b4}$- is, in that the compound will readily be produced, preferably —$CH_2CH_2$—, —$CH_2CH_2CH_2$—, —$CH_2OCH_2CH_2CH_2$—, —$CH_2OCH_2CH_2CH_2CH_2CH_2$—, —$OCH_2CH_2CH_2$—, —$OSi(CH_3)_2CH_2CH_2CH_2$—, —$OSi(CH_3)_2OSi(CH_3)_2CH_2CH_2CH_2$—, or —$CH_2CH_2CH_2Si(CH_3)_2PhSi(CH_3)_2CH_2CH_2$— (provided that the right side is bonded to Si).

The three [—$(O)_{u4}$-$Q^{b4}$-$Si(R)_nL_{3-n}$] may be the same or different.

As specific examples of the group (3-1A-4), the following groups may be mentioned. In the following formulae, * represents the position of bonding to $(OX)_m$.

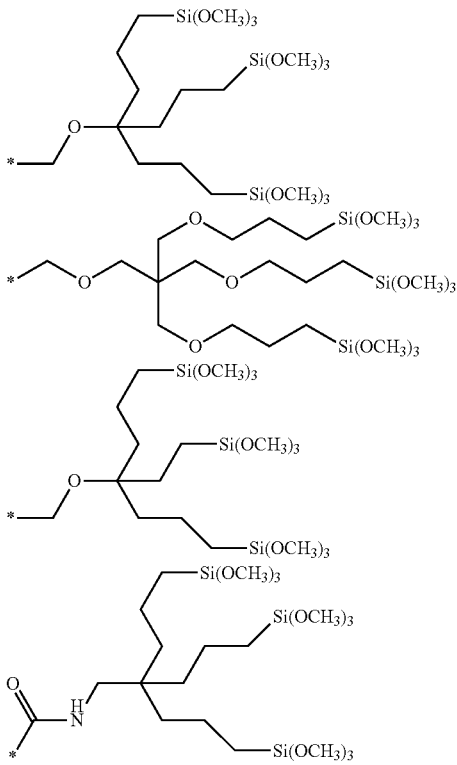

$Q^{a5}$ is an alkylene group which may have an etheric oxygen atom.

The number of carbon atoms in the alkylene group which may have an etheric oxygen atom is preferably from 1 to 10, particularly preferably from 2 to 6.

$Q^{a5}$ is, in that the compound will readily be produced, preferably —$CH_2OCH_2CH_2CH_2$—, —$CH_2OCH_2CH_2OCH_2CH_2CH_2$—, —$CH_2CH_2$—, or —$CH_2CH_2CH_2$— (provided that the right side is bonded to Si).

$Q^{b5}$ is an alkylene group or an alkylene group having at least 2 carbon atoms and having between carbon atom-carbon atom an etheric oxygen atom or a bivalent organopolysiloxane residue.

The number of carbon atoms in the alkylene group represented by $Q^{b5}$ is preferably from 1 to 10, particularly preferably from 2 to 6.

The number of carbon atoms in the alkylene group having at least 2 carbon atoms and having between carbon atom-carbon atom an etheric oxygen atom or a bivalent organopolysiloxane residue, represented by $Q^{b5}$, is preferably from 2 to 10, particularly preferably from 2 to 6.

$Q^{b5}$ is, in that the compound will readily be produced, preferably —$CH_2CH_2CH_2$—, or —$CH_2CH_2OCH_2CH_2CH_2$— (provided that the right side is bonded to $Si(R)_nL_{3-n}$).

The three [-$Q^{b5}$-$Si(R)_nL_{3-n}$] may be the same or different.

As specific examples of the group (3-1A-5), the following group may be mentioned. In the following formula, * represents the position of bonding to $(OX)_m$.

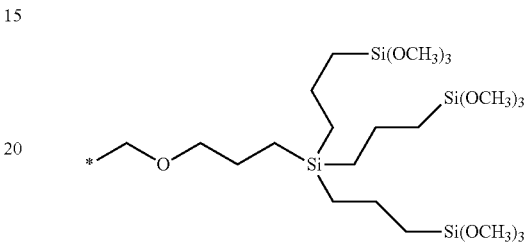

$R^d$ in the formula (3-1A-6) is as defined above.

v is 0 or 1.

$Q^{a6}$ is an alkylene group which may have an etheric oxygen atom.

The number of carbon atoms in the alkylene group which may have an etheric oxygen atom is preferably from 1 to 10, particularly preferably from 2 to 6.

$Q^{a6}$ is, in that the compound will readily be produced, preferably —$CH_2OCH_2CH_2CH_2$—, —$CH_2OCH_2CH_2OCH_2CH_2CH_2$—, —$CH_2CH_2$—, or —$CH_2CH_2CH_2$— (provided that the right side is bonded to $Z^{a'}$).

$Z^{a'}$ is a (w+1) valent organopolysiloxane residue.

w is at least 2, preferably an integer of from 2 to 7.

As the (w+1) valent organopolysiloxane residue, the same group as the (i5+1) valent organopolysiloxane residue may be mentioned.

$Q^{b6}$ is an alkylene group or an alkylene group having at least 2 carbon atoms and having between carbon atom-carbon atom an etheric oxygen atom or a bivalent organopolysiloxane residue.

The number of carbon atoms in the alkylene group represented by $Q^{b6}$ is preferably from 1 to 10, particularly preferably from 2 to 6.

The number of carbon atoms in the alkylene group having at least 2 carbon atoms and having between carbon atom-carbon atom an etheric oxygen atom or a bivalent organopolysiloxane residue, represented by $Q^{b6}$, is preferably from 2 to 10, particularly preferably from 2 to 6.

$Q^{b6}$ is, in that the compound will readily be produced, preferably —$CH_2CH_2$—, or —$CH_2CH_2CH_2$—.

w[-$Q^{b6}$-$Si(R)_{n3}L_{3-n}$] may be the same or different.

As the compound (3X), in that the film will be more excellent in water/oil repellency, compound represented by the formula (3-2) is also preferred.

$$[A\text{-}(OX)_m\text{-}Q^a\text{-}]_{j32}Z^{32}[\text{-}Q^b\text{-}Si(R)_nL_{3-n}]_{h32} \quad (3\text{-}2)$$

In the formula (3-2), A, X, m, $Q^a$, $Q^b$, R, and L are as defined for the respective groups in the formulae (3-1) and (3-1A).

$Z^{32}$ is a (j32+h32) valent hydrocarbon group or a (j32+h32) valent hydrocarbon group having at least 2 carbon atoms and having at least one etheric oxygen atom between carbon atoms.

$Z^{32}$ is preferably a residue having a hydroxy group removed from a polyhydric alcohol having a primary hydroxy group.

$Z^{32}$ is, in view of availability of materials, preferably a group represented by the formulae (Z-1) to (Z-5). In the formula, $R^{34}$ is an alkyl group, preferably a methyl group or an ethyl group.

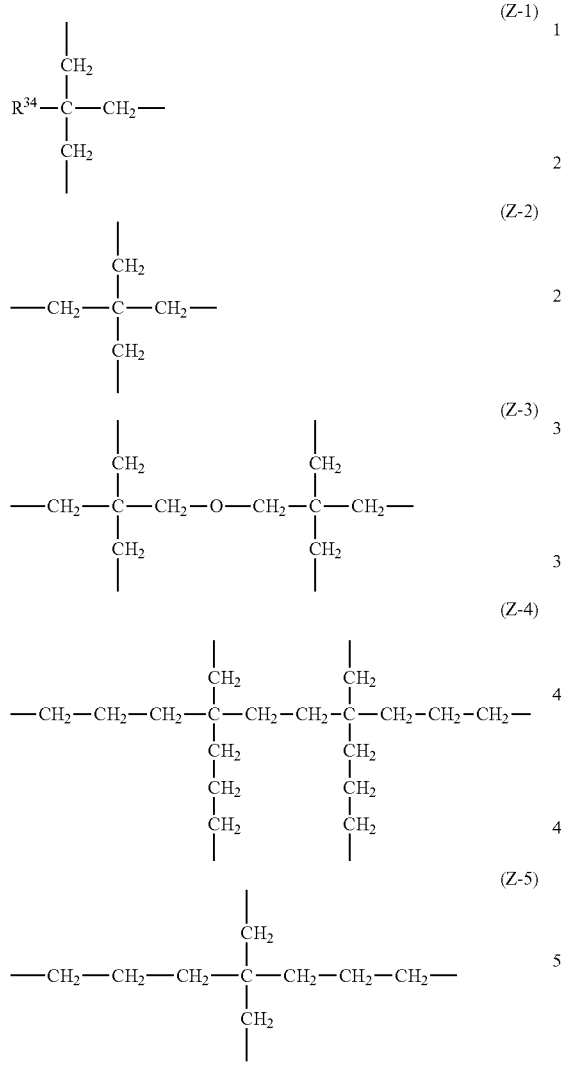

j32 is an integer of at least 2, and in that the film will be more excellent in water/oil repellency, preferably an integer of from 2 to 5. h32 is an integer of at least 1, and in that the film will be more excellent in abrasion resistance, preferably an integer of from 2 to 4, more preferably 2 or 3.

As specific examples of the fluorinated ether compound, for example, compounds as disclosed in the following documents may be mentioned.

Perfluoropolyether-modified aminosilanes described in JP-A-H11-029585 and JP-A-2000-327772, silicon-containing organic fluorinated polymers described in Japanese Patent No. 2874715,g organic silicon compounds described in JP-A-2000-144097, fluorinated siloxanes described in JP-A-2002-506887, organic silicone compounds described in JP-A-2008-534696, fluorinated modified hydrogenated polymers described in Japanese Patent No. 4138936, compounds described in U.S. Patent Application No. 2010/0129672, WO2014/126064 and JP-A-2014-070163, organosilicon compounds described in WO2011/060047 and WO2011/059430, fluorinated organosilane compounds described in WO2012/064649, fluoroxyalkylene group-containing polymers described in JP-A-2012-72272, fluorinated ether compounds described in WO2013/042732, WO2013/121984, WO2013/121985, WO2013/121986, WO2014/163004, JP-A-2014-080473, WO2015/087902, WO2017/038830, WO2017/038832, WO2017/187775, WO2018/216630, WO2019/039186, WO2019/039226, WO2019/039341, WO2019/044479, WO2019/049753, WO2019/163282 and JP-A-2019-044158, perfluoro(poly)ether-containing silane compounds described in JP-A-2014-218639, WO2017/022437, WO2018/079743 and WO2018/143433, perfluoro(poly)ether group-containing silane compounds described in WO2018/169002, fluoro(poly)ether group-containing silane compounds described in WO2019/151442, (poly)ether group-containing silane compounds described in WO2019/151445, perfluoropolyether group-containing compounds described in WO2019/098230, fluoropolyether group-containing polymer-modified silanes described in JP-A-2015-199906, JP-A-2016-204656, JP-A-2016-210854 and JP-A-2016-222859, and fluorinated compounds described in WO2019/039083 and WO2019/049754.

As commercial products of the fluorinated ether compound, KY-100 series (KY-178, KY-185, KY-195, etc.), manufactured by Shin-Etsu Chemical Co., Ltd., Afluid (registered trademark) S550 manufactured by AGC Inc., OPTOOL (registered trademark) DSX, OPTOOL (registered trademark) AES, OPTOOL (registered trademark) UF503, OPTOOL (registered trademark) UD509, etc., manufactured by AIKIN INDUSTRIES, LTD. may, for example, be mentioned.

[Method for Producing Water/Oil Repellent Layer-Provided Substrate]

The water/oil repellent layer-provided substrate of the present invention preferably has an undercoat layer obtained by deposition method or wet coating method. Now, each of preferred embodiments of the method for producing a water/oil repellent layer-provided substrate will be described.

First Embodiment

The method for producing a water/oil repellent layer-provided substrate of the present invention according to a first embodiment is an embodiment of forming the undercoat layer by deposition method.

Specifically, according to the first embodiment, provided is a method for producing a water/oil repellent layer-provided substrate comprising a substrate, an undercoat layer and a water/oil repellent layer in this order, which comprises forming on the substrate the undercoat layer containing an oxide containing silicon and at least one element selected from the group consisting of titanium, zirconium and aluminum, the ratio of the total molar concentration of titanium, zirconium and aluminum to the molar concentration of silicon being from 0.03 to 0.7, by deposition method using the deposition material (described hereinafter) and forming on the undercoat layer the water/oil repellent layer comprising a condensate of a fluorinated compound having a reactive silyl group (hereinafter sometimes referred to as "fluorinated compound").

The substrate, the undercoat layer and the water/oil repellent layer are as described for the above water/oil repellent layer-provided substrate of the present invention and their descriptions are omitted.

As specific examples of the deposition method using a deposition material, vacuum deposition method may be mentioned. The vacuum deposition method is a method of evaporating the deposition material in a vacuum chamber to make it attached to the surface of the substrate.

The temperature at the time of deposition (for example, in a case where a vacuum deposition apparatus is used, the temperature of the boat on which the deposition material is placed) is preferably from 100 to 3,000° C., particularly preferably from 500 to 3,000° C.

The pressure at the time of deposition (for example, in a case where a vacuum deposition apparatus is used, the pressure in the chamber in which the deposition material is placed) is preferably at most 1 Pa, particularly preferably at most 0.1 Pa.

When the undercoat layer is formed by using the deposition material, one deposition material may be used, or two or more deposition materials containing different elements may be used.

As specific examples of the method of evaporating the deposition material, resistance heating method in which the deposition material is melted and evaporated on a high melting metal boat for resistance heating, or electron gun method in which electron beams are applied to the deposition material to directly heat the deposition material and to melt its surface thereby to evaporate it, may be mentioned. As the method of evaporating the deposition material, electron gun method is preferred in that a high melting substance can be evaporated since local heating is possible, and reaction with the container and inclusion of impurities are less likely to occur since the temperature of the portion not irradiated with the electron beams is low.

As the method of evaporating the deposition material, a plurality of boats may be used, or the entire deposition material may be put in a single boat. The deposition method may be co-deposition, alternating deposition or the like. Specifically, an example in which silica, and a compound containing titanium, a compound containing zirconium, a compound containing aluminum or the like are mixed in a single boat, an example in which silica, and a compound containing titanium, a compound containing zirconium, a compound containing aluminum or the like are put in separate boats and subjected to co-deposition, or an example in which they are put in separate boats and subjected to alternating deposition, may be mentioned. The deposition conditions, order, and the like are properly selected depending upon the structure of the undercoat layer.

In order to prevent contamination of a region or portion (for example, the rear side of the substrate) on which the deposition material should not be deposited, at the time of deposition, such region or portion may be covered with a protective film.

After deposition, with a view to improving the film quality, it is preferred to conduct humidification. The temperature at the time of humidification is preferably from 25 to 160° C. The relative humidity is preferably at least 40%, and the treatment time is preferably at least 1 hour.

The water/oil repellent layer may be formed either by dry coating or wet coating, using a fluorinated compound or a composition containing a fluorinated compound and a liquid medium (hereinafter sometimes referred to as "composition").

As specific examples of the liquid medium contained in the composition, water and an organic solvent may be mentioned. As specific examples of the organic solvent, a fluorinated organic solvent and a non-fluorinated organic solvent may be mentioned. The organic solvents may be used alone or in combination of two or more.

As specific examples of the fluorinated organic solvent, a fluorinated alkane, a fluorinated aromatic compound, a fluoroalkyl ether, a fluorinated alkylamine and a fluoroalcohol may be mentioned.

The fluorinated alkane is preferably a compound having 4 to 8 carbon atoms, and may, for example, be $C_6F_{13}H$ (AC-2000, trade name, manufactured by AGC Inc.), $C_6F_{13}C_2H5$ (AC-6000, trade name, manufactured by AGC Inc.), or $C_2F_5CHFCHFCF_3$ (Vertrel, trade name, manufactured by DuPont).

As specific examples of the fluorinated aromatic compound, hexafluorobenzene, trifluoromethylbenzene, perfluorotoluene, 1,3-bis(trifluoromethyl)benzene, and 1,4-bis(trifluoromethyl)benzene may be mentioned.

The fluoroalkylether is preferably a compound having from 4 to 12 carbon atoms, and may, for example, be $CF_3CH_2O\ CF_2CF_2H$ (AE-3000, trade name, manufactured by AGC Inc.), $C_4F_9OCH_3$ (Novec-7100, trade name, manufactured by 3M), $C_4F_9OC_2H_5$ (Novec-7200, trade name, manufactured by 3M), and $C_2F_5CF(OCH_3)C_3F_7$ (Novec-7300, trade name, manufactured by 3M).

As specific examples of the fluorinated alkylamine, perfluorotripropylamine and perfluorotributylamine may be mentioned.

As specific examples of the fluoroalcohol, 2,2,3,3-tetrafluoropropanol, 2,2,2-trifluoroethanol and hexafluoroisopropanol may be mentioned.

The non-fluorinated organic solvent is preferably a compound consisting solely of hydrogen atoms and carbon atoms, or a compound consisting solely of hydrogen atoms, carbon atoms and oxygen atoms, and may be specifically a hydrocarbon organic solvent, a ketone organic solvent, an ether organic solvent, an ester organic solvent or an alcohol organic solvent.

As specific examples of the hydrocarbon organic solvent, hexane, heptane and cyclohexane may be mentioned.

As specific examples of the ketone organic solvent, acetone, methyl ethyl ketone and methyl isobutyl ketone may be mentioned.

As specific examples of the ether organic solvent, diethyl ether, tetrahydrofuran and tetraethylene glycol dimethyl ether may be mentioned.

As specific examples of the ester organic solvent, ethyl acetate and butyl acetate may be mentioned.

As specific examples of the alcohol organic solvent, isopropyl alcohol, ethanol and n-butanol may be mentioned.

The content of the fluorinated compound in the composition is, to the total mass of the composition, preferably from 0.01 to 50 mass %, particularly preferably from 1 to 30 mass %.

The content of the liquid medium in the composition is, to the total mass of the composition, preferably from 50 to 99.99 mass %, particularly preferably from 70 to 99 mass %.

The water/oil repellent layer may be produced, for example, by the following method.

A method of treating the surface of the undercoat layer by dry coating method using the fluorinated compound, to form the water/oil repellent layer on the surface of the undercoat layer.

A method of applying the composition to the surface of the undercoat layer by wet coating method, followed by drying to form the water/oil repellent layer on the surface of the undercoat layer.

As specific examples of the dry coating method, vacuum deposition method, CVD method and sputtering method may be mentioned. Among them, with a view to suppressing decomposition of the fluorinated compound and in view of simplicity of the apparatus, vacuum deposition method is preferred. At the time of vacuum deposition, a pellet-form substance having a metal porous body of e.g. iron or steel impregnated with the fluorinated compound or a pellet-form substance having a metal porous body impregnated with the composition, followed by drying, may be used.

As specific examples of the wet coating method, spin coating method, wipe coating method, spray coating method, squeeze coating method, dip coating method, die coating method, ink-jet method, flow coating method, roll coating method, casting method, Langmuir-Blodgett method and gravure coating method may be mentioned.

The drying temperature after applying the composition by wet coating is preferably from 20 to 200° C., particularly preferably from 80 to 160° C.

In order to improve abrasion resistance of the water/oil repellent layer, as the case requires, an operation to accelerate the reaction between the fluorinated compound having a reactive silyl group and the undercoat layer may be conducted. Such an operation may, for example, be heating, humidification or light irradiation. For example, the undercoat layer-provided substrate having a water/oil repellent layer formed thereon may be heated in the air containing moisture to accelerate e.g. hydrolysis of the reactive silyl group into a silanol group, formation of a siloxane bond by condensation reaction of the silanol groups, or condensation reaction of the silanol group on the surface of the undercoat layer and the silanol group of the fluorinated compound.

After the surface treatment, the compound in the water/oil repellent layer, which is not chemically bonded to other compound or the silicon oxide layer, may be removed as the case requires. As a specific method, for example, a method of rinsing the water/oil repellent layer with a solvent, a method of wiping the water/oil repellent layer with cloth impregnated with a solvent, or a method of washing the surface of the water/oil repellent layer with an acid may be mentioned.

<Deposition Material>

The deposition material of the present invention is a deposition material to be used to form an undercoat layer of a water/oil repellent layer comprising a condensate of a fluorinated compound having a reactive silyl group, wherein the deposition material contains an oxide containing silicon and at least one element selected from the group consisting of titanium, zirconium and aluminum, and the ratio of the total molar concentration of titanium, zirconium and aluminum to the molar concentration of silicon is from 0.2 to 4.

In the present invention, the deposition material means a material to be used for deposition. The deposition material of the present invention is suitably used for forming the undercoat layer of the water/oil repellent layer-provided substrate.

The oxide contained in the deposition material may contain only one or may contain two or more among titanium, zirconium and aluminum, and preferably contains at least one element selected from the group consisting of titanium and zirconium, particularly preferably contains titanium. In a case where the oxide contains three of titanium, zirconium and aluminum, the proportion of the total amount of titanium and zirconium to the total amount of the three is preferably at least 20 mol %. In a case where the oxide contains two of titanium and zirconium, the proportion of the amount of titanium to the total amount of the two is preferably at least 50 mol %.

The oxide contained in the deposition material may be a mixture of oxides each containing only one of the above elements (silicon, titanium, zirconium and aluminum) (for example, a mixture of silicon oxide and at least one oxide selected from the group consisting of titanium oxide, zirconium oxide and aluminum oxide), may be a composite oxide containing two or more of the above elements, or may be a mixture of the oxide containing one of the above elements and the composite oxide.

The content of the oxide in the deposition material is, based on the total mass of the deposition material, in that the water/oil repellent layer will be more excellent in abrasion resistance, preferably at least 80 mass %, more preferably at least 95 mass %, particularly preferably 100 mass % (the deposition material is entirely formed of the oxide).

The content of oxygen in the deposition material is, as the molar concentration (mol %) of oxygen atoms to all the elements in the deposition material, in that the water/oil repellent layer will be more excellent in abrasion resistance, preferably from 40 to 70 mol %, more preferably from 50 to 70 mol %, particularly preferably from 60 to 70 mol %. The content of oxygen in the deposition material is measured e.g. by XPS with respect to a sample having the deposition material sufficiently ground and pelletized.

The content of silicon in the deposition material is, as the molar concentration (mol %) of silicon to all the elements excluding oxygen in the deposition material, in that the water/oil repellent layer will be more excellent in abrasion resistance, preferably from 14 to 97 mol %, more preferably from 22 to 97 mol %, particularly preferably from 30 to 94 mol %.

The content of silicon in the deposition material is, as the mass percent concentration (mass %) of silicon to all the elements excluding oxygen in the deposition material, in that the water/oil repellent layer will be more excellent in abrasion resistance, preferably from 10 to 99.9 mass %, more preferably from 15 to 97 mass %, particularly preferably from 20 to 95 mass %.

The ratio of the total molar concentration of titanium, zirconium and aluminum in the deposition material to the molar concentration of silicon in the deposition material is from 0.2 to 4, and in that the water/oil repellent layer will be more excellent in abrasion resistance, preferably from 0.25 to 2.0, particularly preferably from 0.3 to 1.5.

The total content of titanium, zirconium and aluminum in the deposition material is, as the total molar concentration (mol %) of titanium, zirconium and aluminum to all the elements excluding oxygen in the deposition material, in that the water/oil repellent layer will be more excellent in abrasion resistance, preferably from 17 to 80 mol %, more preferably from 20 to 67 mol %, particularly preferably from 24 to 60 mol %.

The total content of titanium, zirconium and aluminum in the deposition material is, as the total mass percent concentration (mass %) of titanium, zirconium and aluminum to all the elements excluding oxygen in the deposition material, in that the water/oil repellent layer will be more excellent in abrasion resistance, preferably from 26 to 88 mass %, more preferably from 30 to 78 mass %, particularly preferably from 35 to 72 mass %.

The oxide contained in the deposition material may further contain an alkali metal element, in that the water/oil repellent layer will be more excellent in abrasion resistance. The preferred embodiments of the alkali metal element are the same as those for the undercoat layer and their descriptions are omitted.

The alkali metal element may be present in the form of an oxide of one type of alkali metal element, or may be present in the form of a composite oxide of one or more types of alkali metal elements and the above element (silicon, titanium, zirconium or aluminum).

In a case where the oxide contained in the deposition material contains the alkali metal element, the ratio of the total molar concentration of the alkali metal element in the deposition material to the molar concentration of silicon in the deposition material is, in that the water/oil repellent layer will be more excellent in abrasion resistance, preferably at most 1.0, particularly preferably from 0.001 to 0.5.

In a case where the oxide contained in the deposition material contains the alkali metal element, the content of the alkali metal element in the deposition material is, as the total molar concentration (mol %) of the alkali metal element to all the elements excluding oxygen in the deposition material, in that the water/oil repellent layer will be more excellent in abrasion resistance, preferably at most 30 mol %, more preferably at most 20 mol %, particularly preferably from 0.1 to 15 mol %.

In a case where the oxide contained in the deposition material contains the alkali metal element, the content of the alkali metal element in the deposition material is, as the mass percent concentration (mass %) of the alkali metal element to all the elements excluding oxygen in the deposition material, in that the water/oil repellent layer will be more excellent in abrasion resistance, preferably at most 40 mass %, more preferably at most 30 mass %, particularly preferably from 0.1 to 20 mass %.

The oxide contained in the deposition material may further contain boron, in that the water/oil repellent layer will be more excellent in abrasion resistance.

Boron may be present in the form of an oxide of only boron, or may be present in the form of a composite oxide of boron and the above element (silicon, titanium, zirconium or aluminum).

In a case where the oxide contained in the deposition material contains boron, the ratio of the molar concentration of boron in the deposition material to the molar concentration of silicon in the deposition material is, in that the water/oil repellent layer will be more excellent in abrasion resistance, preferably at most 1.0, particularly preferably from 0.001 to 0.5.

In a case where the oxide contained in the deposition material contains boron, the content of boron in the deposition material is, as the molar concentration (mol %) of boron to all the elements excluding oxygen in the deposition material, in that the water/oil repellent layer will be more excellent in abrasion resistance, preferably at most 25 mol %, more preferably at most 20 mol %, particularly preferably from 0.5 to 15 mol %.

In a case where the oxide contained in the deposition material contains boron, the content of boron in the deposition material is, as the total mass percent concentration (mass %) of boron to all the elements excluding oxygen in the deposition material, in that the water/oil repellent layer will be more excellent in abrasion resistance, preferably at most 15 mass %, more preferably at most 13 mass %, particularly preferably from 0.1 to 10 mass %.

The oxide contained in the deposition material may further contain at least one metal element selected from the group consisting of nickel, iron, molybdenum and tungsten, within a range where they will not be contained in the undercoat layer obtained by deposition.

The metal element may be present in the form of an oxide of one type of element, or may be present in the form of a composite oxide of one or more types of the metal elements and the above element (silicon, titanium, zirconium or aluminum).

In a case where the oxide contained in the deposition material contains the metal element, the ratio of the total molar concentration of the metal element in the deposition material to the molar concentration of silicon in the deposition material is, in that the water/oil repellent layer will be more excellent in abrasion resistance, preferably at most 0.01, particularly preferably at most 0.001.

In a case where the oxide contained in the deposition material contains the metal element, the content of the metal element in the deposition material is, as the total molar concentration (mol %) of the metal element to all the elements excluding oxygen in the deposition material, preferably at most 1 mol %, particularly preferably at most 0.1 mol %. When the content of the metal element in the deposition material is at most 1 mol %, the metal element will hardly be contained in the undercoat layer obtained by deposition, or even if contained, the amount is small, whereby performance of the water/oil repellent layer and the undercoat layer is less likely to be impaired.

The content of the metal element means, when one type of metal element is contained, the content of the one element, and when two or more types of metal elements are contained, the total content of the respective elements.

As specific examples of the form of the deposition material, a powder, a molten body, a sintered body, granules and a pulverized body may be mentioned, and in view of handling efficiency, a molten body, a sintered body and granules are preferred.

The molten body means a solid obtained by melting a powder of the deposition material at high temperature and cooling and solidifying it. The sintered body means a solid obtained by firing a powder of the deposition material and as the case requires, formed product obtained by pressing the powder may be used, instead of the powder of the deposition material. Granules mean a solid obtained by kneading a powder of the deposition material and a liquid medium (such as water or an organic solvent) to obtain particles, and drying the particles.

The deposition material may be produced, for example, by the following method.

- A method of mixing a powder of silicon oxide and a powder of an oxide of at least one element selected from the group consisting of titanium, zirconium and aluminum to obtain a powder of the deposition material.
- A method of kneading a powder of the deposition material and water to obtain particles, and drying the particles to obtain granules of the deposition material.

To increase the yield at the time of granulation and to uniformalize element distribution during granulation, the diameter of the silicon oxide powder as the material is preferably from 0.1 μm to 100 μm. In a case where a silicon oxide powder of 100 μm or larger is used as the material, it is used preferably as ground. To increase the strength of the granules and to avoid adhesion at the time of firing when the sintered body is to be obtained, the drying temperature is preferably at least 60° C. Further, to completely remove moisture, drying in a reduced pressure state (absolute pressure of at most 50 kPa) is preferred.

> A method of drying a mixture of a powder containing silicon (for example, a powder consisting of silicon oxide, silica sand or silica gel), a powder of at least one element selected from the group consisting of titanium, zirconium and aluminum (for example, a powder of the oxide of the element) and water, and firing the dried mixture, a formed product obtained by pressing the mixture, or the granules, to obtain a sintered body.

To lower moisture absorption property of the sintered body after firing, the firing temperature is preferably at least 900° C., more preferably at least 1,000° C. To prevent breakage of a carrier container (packaging bag) and to prevent contamination from the container at the time of carrying the sintered body, particles having no protrusion are preferred, and spherical particles are more preferred. To remove the protrusions, it is preferred to add protrusions removal process.

> A method of melting a powder containing silicon (for example, a powder consisting of silicon oxide, silica sand or silica gel) and a powder of at least one element selected from the group consisting of titanium, zirconium and aluminum (for example, a powder of the oxide of the element) at high temperature, and cooling and solidifying the melt to obtain the molten body.

Second Embodiment

The method for producing a water/oil repellent layer-provided substrate of the present invention according to a second embodiment is an embodiment of forming the undercoat layer by wet coating method.

Specifically, according to the second embodiment, provided is a method for producing a water/oil repellent layer-provided substrate comprising a substrate, an undercoat layer and a water/oil-repellent layer in this order, which comprises forming on the substrate the undercoat layer containing an oxide containing silicon and at least one element selected from the group consisting of titanium, zirconium and aluminum, the ratio of the total molar concentration of titanium, zirconium and aluminum to the molar concentration of silicon being from 0.03 to 0.7, by wet coating method using a coating fluid containing a compound containing silicon, at least one compound selected from the group consisting of a compound containing titanium, a compound containing zirconium and a compound containing aluminum, and a liquid medium, and forming on the undercoat layer the water/oil repellent layer comprising a condensate of a fluorinated compound having a reactive silyl group.

The substrate, the undercoat layer and the water/oil repellent layer are as defined for the water/oil repellent layer-provided substrate of the present invention, and their descriptions are omitted.

The specific examples of the wet coating method to form the undercoat layer are the same as those for forming the water/oil repellent layer by wet coating method according to the first embodiment, and their descriptions are omitted.

After applying the coating fluid by wet coating, the coating film is preferably dried. The drying temperature of the coating film is preferably from 20 to 200° C., particularly preferably from 80 to 160° C.

The method for forming the water/oil repellent layer according to the second embodiment is the same as the method for forming the water/oil repellent layer according to the first embodiment, and its description is omitted.

Further, in the second embodiment also, an operation to improve abrasion resistance of the water/oil repellent layer as described for the first embodiment may be conducted.

<Coating Fluid to be Used for Forming Undercoat Layer>

The coating fluid to be used for forming the undercoat layer contains a compound containing silicon, at least one compound selected from the group consisting of a compound containing titanium, a compound containing zirconium and a compound containing aluminum, and a liquid medium.

As specific examples of the silicon compound, silicon oxide, silicic acid, a partial condensate of silicic acid, an alkoxysilane, and a partially hydrolyzed condensate of an alkoxysilane may be mentioned.

The content of the silicon compound may properly be set so that the content of silicon in the undercoat layer will be within the above range.

Specific examples of the compound containing titanium, titanium oxide, a titanium alkoxide, and a partially hydrolyzed condensate of a titanium alkoxide may be mentioned.

The content of the compound containing titanium may properly be set so that the ratio of the total molar concentration of titanium, zirconium and aluminum to the molar concentration of silicon in the undercoat layer will be within the above range.

As specific examples of the compound containing zirconium, zirconium oxide, a zirconium alkoxide and a partially hydrolyzed condensate of a zirconium alkoxide may be mentioned.

The content of the compound containing zirconium may properly be set so that the ratio of the total molar concentration of titanium, zirconium and aluminum to the molar concentration of silicon in the undercoat layer will be within the above range.

As specific examples of the compound containing aluminum, aluminum oxide, an aluminum alkoxide, and a partially hydrolyzed condensate of an aluminum alkoxide may be mentioned.

The content of the compound containing aluminum may properly be set so that the ratio of the total molar concentration of titanium, zirconium and aluminum to the molar concentration of silicon in the undercoat layer will be within the above range.

The coating fluid may further contain a compound containing an alkali metal element.

As the compound containing an alkali metal element, an oxide of an alkali metal element, and an alkoxide of an alkali metal element may be mentioned.

The content of the compound containing an alkali meal element may properly be set so that the ratio of the molar concentration of the alkali metal element to the molar concentration of silicon in the undercoat layer will be within the above range.

The coating fluid may further contain boron.

Specific examples of the compound containing boron, boron oxide, boric acid, an alkoxyborane, and a partially hydrolyzed condensate of an alkoxyborane may be mentioned.

The content of the compound containing boron may properly be set so that the ratio of the molar concentration of boron to the molar concentration of silicon in the undercoat layer will be within the above range.

Specific examples of the liquid medium contained in the coating fluid are the same as those mentioned for formation of the water/oil repellent layer according to the first embodiment, and their descriptions are omitted.

The content of the liquid medium is, to the total mass of the coating fluid to be used for forming the undercoat layer, preferably from 0.01 to 20 mass %, particularly preferably from 0.01 to 10 mass %.

EXAMPLES

Now, the present invention will be described in further detail with reference to Examples. However, it should be understood that the present invention is by no means restricted thereto. Ex. 1 to 7 and 10 to 23 are Examples of the present invention, and Ex. 8 and 9 are Comparative Examples.

[Physical Properties and Evaluation]
(Content of Each Element in Undercoat Layer)

In Ex. other than Ex. 6, a depth profile of the molar concentration (mol %) of each element was obtained by X-ray photoelectron spectroscopy (XPS) using Ar ion sputtering. In Ex. 6, a depth profile of the molar concentration (mol %) of each element was obtained by X-ray photoelectron spectroscopy (XPS) using $C_{60}$ ion sputtering. The point where the molar concentration (mol %) of fluorine derived from the water/oil repellent layer to all the elements detected by XPS analysis is 10 mol % or lower as observed from the surface side of the depth profile of the water/oil repellent layer-provided substrate, was taken as the starting point A. Further, the point where the molar concentration (mol %) of an optional element present only in the substrate to all the elements detected by XPS analysis exceeds 30% of the molar concentration (mol %) in the substrate for the first time, was taken as the end point B. The region from the starting point A to the end point B is defined as the undercoat layer, and the ratio of the average of the molar concentration (mol %) of the element to be measured to the average of the molar concentration (mol %) of silicon in the undercoat layer was calculated. In a case where an alkali metal element is contained in the undercoat layer as in Ex. 6, it is preferred to employ $C_{60}$ ion sputtering. Further, in Ex. other than Ex. 4, aluminum was selected as an optional element present only in the substrate, and in Ex. 4, potassium was selected as an optional element present only in the substrate. In a case where aluminum is not contained in the undercoat layer and aluminum is contained in the substrate, it is preferred to select aluminum as an optional element present only in the substrate.

Ex. Other than Ex. 6

<Apparatus>
X-ray photoelectron spectroscope: Quantera-SXM manufactured by ULVAC-PHI, Inc.

<Measurement Conditions>
X-ray source: monochromatized AlKα ray
Beam diameter of X-ray: about 100 μmφ
Photoelectron detection angle: 45 degrees to sample surface
Pass energy: 224 eV
Step energy: 0.4 eV/step
Sputter ion: Ar ion with accelerating voltage of 1 kV
Raster size of sputtering gun: 3×3 mm²
Sputtering interval: one minute
Sputtering rate of thermally oxidized film ($SiO_2$ film) of sputtering gun on silicon wafer: 0.78 nm/min
Measurement interval: 0.78 nm (as calculated as thermally oxidized film on silicon wafer)

Ex. 6

<Apparatus>
X-ray photoelectron spectroscope: ESCA-5500 manufactured by ULVAC-PHI, Inc.

<Measurement Conditions>
X-ray source: monochromatized AlKα ray
Photoelectron detection angle: 75 degrees to sample surface
Pass energy: 117.4 eV
Step energy: 0.5 eV/step
Sputter ion: $C_{60}$ ion with accelerating voltage of 10 kV
Raster size of sputtering gun: 3×3 mm²
Sputtering interval: 0.4 minute
Sputtering rate of thermally oxidized film ($SiO_2$ film) of sputtering gun on silicon wafer: 2.20 nm/min
Measurement interval: 0.88 nm (as calculated as thermally oxidized film on silicon wafer)

(Content of Each Element in Deposition Material)

3 to 10 g of a deposition material sample was preliminarily sufficiently ground and pulverized and subjected to silicon/boron and titanium/zirconium/aluminum/alkali metal element analysis.

<Silicon/Boron>

0.5 to 1.0 g of sodium hydroxide was put in a zirconia crucible, melted by a burner and air-cooled. 100 mg of the pulverized sample was added on the sodium hydroxide and melted by a burner at a burning temperature of about 600° C. for one minute. After air-cooling, the crucible was put in a beaker or a plastic container. Pure water was added to the crucible for dissolution by heating. The melt was put in the beaker or the plastic container, and 20 mL of 6M hydrochloric acid was added all at once. The volume was adjusted to 100 mL, and after dilution, silicon and boron contents (mass %) were quantitatively determined by ICP atomic emission spectrometry (measurement apparatus: PS3520UVDDII, trade name, manufactured by Hitachi High-Tech Science Corporation). For quantitative determination, analytical curve (matrix matching) method was employed.

And, the ratio (mass ratio) of the content (mass %) of the element to be measured to the content (mass %) of silicon was calculated, and the molar ratio was obtained from the mass ratio using the atomic weight of each element.

<Titanium/Zirconium/Aluminum/Alkali Metal Element>

100 mg of the pulverized sample was decomposed with hydrofluoric acid/sulfuric acid or hydrofluoric acid/perchloric acid, silicon and boron were removed, and nitric acid or hydrochloric acid was added to form a solution. It was confirmed that all the components were dissolved. The volume was adjusted to 100 mL, and after dilution, the contents of titanium, zirconium and aluminum were quantitatively determined by ICP atomic emission spectrometry (measurement apparatus: PS3520UVDDII, trade name, manufactured by Hitachi High-Tech Science Corporation). Further, the content (mass %) of the alkali metal element was quantitatively determined by atomic absorption spectrometry (measurement apparatus: ZA3300, trade name, manufactured by Hitachi High-Tech Science Corporation). For quantitative determination, analytical curve (matrix matching) method was employed.

And, the ratio (mass ratio) of the content (mass %) of the element to be measured to the content (mass %) of silicon was calculated, and the molar ratio was obtained from the mass ratio using the atomic weight of each element.
(Abrasion Resistance 1 (Felt Abrasion))

With respect to the water/oil repellent layer, using a felt abrasion testing machine, felt (dimensions: 10 mm×10 mm×50 mm) was reciprocated under a load of 9.8N at a rate of 80 rpm. After felt abrasion of 10,000 times reciprocation, the water contact angle of the water/oil repellent layer was measured, and the abrasion resistance was evaluated in accordance with the following evaluation standards. The smaller the decrease in the water contact angle after abrasion, the smaller the decrease in performance due to abrasion, and the more excellent the abrasion resistance.
⊚: Water contact angle of at least 105°
◯: Water contact angle of at least 100° and less than 105°
x: Water contact angle of less than 100°
(Abrasion Resistance 2)

Conducted in the same manner as for evaluation of abrasion resistance 1, except that the number of reciprocations was 20,000.
⊚: Water contact angle of at least 105°
◯: Water contact angle of at least 100° and less than 105°
x: Water contact angle of less than 100°
(Abrasion Resistance 3)

Conducted in the same manner as for evaluation of abrasion resistance 1, except that the number of reciprocations was 25,000.
⊚: Water contact angle of at least 100°
◯: Water contact angle of at least 90° and less than 100°
Δ: Water contact angle of at least 80° and less than 90°
x: Water contact angle of less than 80°
[Preparation of Fluorinated Compound]

Preparation Example 1

Compound (3A) was obtained with reference to the method for producing compound (ii-2) described in WO2014/126064.

$$CF_3CF_2-OCF_2CF_2-(OCF_2CF_2CF_2CF_2OCF_2CF_2)_n-OCF_2CF_2CF_2-C(O)NH-CH_2CH_2CH_2-Si(OCH_3)_3 \quad (3A)$$

Average of number n of units: 13, number average molecular weight of compound (3A): 4,920

Preparation Example 2

Compound (1-1A) was obtained in accordance with the method described in Ex. 3 of WO2017/038832.

$$CF_3-(OCF_2CF_2-OCF_2CF_2CF_2)_{x3}(OCF_2CF_2)-OCF_2CF_2CF_2-CH_2-N[CH_2CH_2CH_2-Si(OCH_3)_3]_2 \quad (1\text{-}1A)$$

Average of number×3 of units: 13, Mn of compound (1-1A): 5,020

Preparation Example 3

Compounds (1-1X) and (1-1B) were obtained in accordance with the method described in Ex. 11 of WO2017/038830.

$$CF_3-(OCF_2CF_2OCF_2CF_2CF_2CF_2)_n(OCF_2CF_2)-OCF_2CF_2CF_2-C(O)NH-CH_2-C[CH_2CH=CH_2]_3 \quad (1\text{-}1X)$$

$$CF_3-(OCF_2CF_2OCF_2CF_2CF_2CF_2)_n(OCF_2CF_2)-OCF_2CF_2CF_2-C(O)NH-CH_2-C[CH_2CH_2CH_2-Si(OCH_3)_3]_3 \quad (1\text{-}1B)$$

Average of number n of units: 13, Mn of compound (1-1B): 5,400

Preparation Example 4

Compound (1-1C) was obtained in accordance with the method described in Preparation Example 15 of Japanese Patent No. 5761305.

$$CF_3(OCF_2CF_2)_{15}(OCF_2)_{16}OCF_2CH_2OCH_2CH_2CH_2Si[CH_2CH_2CH_2Si(OCH_3)_3]_3 \quad (1\text{-}1C)$$

Mn of compound (1-1C): 3,600

Preparation Example 5

Compound (1-2A) was obtained in accordance with Ex. 16 in WO2017/187775.

The group represented by "PFPE" in the formula (1-2A) is $CF_3(OCF_2CF_2OCF_2CF_2CF_2CF_2)_{x3}OCF_2CF_2OCF_2CF_2CF_2-$. In the formula, the average of the number X3 of units is 13.

Mn of compound (1-2A): 10,100

(1-2A)

Preparation Example 6

Compound (1-2B) was prepared as follows.

Into a reactor the interior of which was replaced with nitrogen, 21.8 g of NaH weighed in a box the interior of which was replaced with nitrogen was charged to 100 g of dehydrated THF (tetrahydrofuran), followed by stirring in an ice bath, and 40 g of a 50 mass % malononitrile solution having malononitrile dissolved in dehydrated THF was added, and then 80.6 g of allyl bromide was added, followed by stirring in an ice bath for 4 hours. Diluted aqueous hydrochloric acid solution was added and the reaction was terminated, followed by washing with water and a saturated salt solution, and an organic phase was recovered. The recovered solution was concentrated by an evaporator to obtain a crude product. The crude product was subjected to silica gel column chromatography to obtain 42 g of compound (X5-1).

(X5-1)

Into an eggplant flask having a capacity of 300 mL, the interior of which was replaced with nitrogen, 31.1 g of LiAlH$_4$ and 100 g of dehydrated THF were added, followed by stirring in an ice bath until the temperature reached 0° C. 40 g of compound (X5-1) was slowly added dropwise. Disappearance of compound (X5-1) was confirmed by thin layer chromatography, and to the reaction crude liquid, Na$_2$SO$_4$·10H$_2$O was slowly added for quenching, followed by filtration with celite, and by washing with water and a saturated salt solution. The recovered organic layer was distilled under reduced pressure and purified by column chromatography to obtain 32.5 g of compound (X5-2).

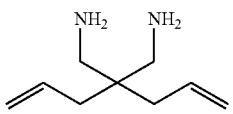
(X5-2)

Into a 50 mL eggplant flask, 0.4 g of compound (X5-2) and 27 g of CF$_3$(OCF$_2$CF$_2$OCF$_2$CF$_2$CF$_2$)$_{13}$OCF$_2$CF$_2$OCF$_2$CF$_2$CF$_2$—C(O)—CH$_3$ were added, followed by stirring for 12 hours. It was confirmed by NMR that compound (X5-2) was entirely converted to compound (X5-3). Further, methanol was formed as a by-product. The obtained solution was diluted with 9.0 g of AE-3000 and purified by silica gel column chromatography (developing solvent: AE-3000) to obtain 16.3 g (yield: 66%) of compound (X5-3).

In the following formula, PFPE means

CF$_3$(OCF$_2$CF$_2$OCF$_2$CF$_2$CF$_2$CF$_2$)$_{13}$OCF$_2$CF$_2$OCF$_2$CF$_2$CF$_2$—.

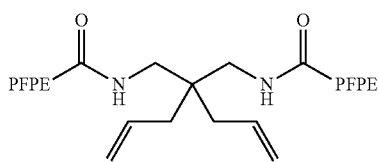
(X5-3)

Into a 100 mL PFA eggplant flask, 5.0 g of compound (X5-3), 0.5 g of a xylene solution (platinum content: 2%) of platinum/1,3-divinyl-1,1,3,3-tetramethyldisiloxane complex, 0.3 g of HSi(OCH$_3$)$_3$, 0.02 g of dimethyl sulfoxide and 5.0 g of 1,3-bis(trifluoromethyl)benzene (manufactured by Tokyo Chemical Industry Co., Ltd.) were put, followed by stirring at 40° C. for 10 hours. After completion of the reaction, the solvent and the like were distilled off under reduced pressure, and the residue was subjected to filtration through a membrane filter having a pore size of 0.2 µm to obtain compound (1-2B) having two allyl groups of compound (X5-3) hydrosilylated. The degree of conversion of hydrosilylation was 100%, and no compound (X5-3) remained.

In the following formula, PFPE means

CF$_3$(OCF$_2$CF$_2$OCF$_2$CF$_2$CF$_2$CF$_2$)$_{13}$OCF$_2$CF$_2$OCF$_2$CF$_2$CF$_2$—.

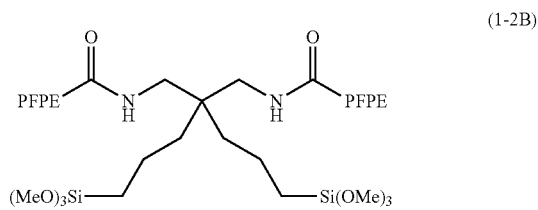
(1-2B)

Mn of compound (1-2B): 9,800

Preparation Example 7

Mixture (M1) containing the following compounds (1-3A) and (1-1 D) was prepared as follows.

Preparation Example 7-1

Compound (X6-1) was obtained in accordance with the method described in Ex. 1-1 of WO2013-121984.

CF$_2$=CFO—CF$_2$CF$_2$CF$_2$CH$_2$OH    (X6-1)

Preparation Example 7-2

Into a 200 mL eggplant flask, 16.2 g of HO—CH$_2$CF$_2$CF$_2$CH$_2$—OH and 13.8 g of potassium carbonate were put, followed by stirring at 120° C., and 278 g of compound (X4-1) was added, followed by stirring at 120° C. for 2 hours. The temperature was returned to 25° C., and 50 g of AC-2000 (trade name, manufactured by AGC Inc., C$_6$F$_{13}$H) and 50 g of hydrochloric acid were put, followed by liquid separation, and the resulting organic phase was concentrated. The obtained reaction crude liquid was purified by column chromatography to obtain 117.7 g (yield: 40%) of compound (X6-2).

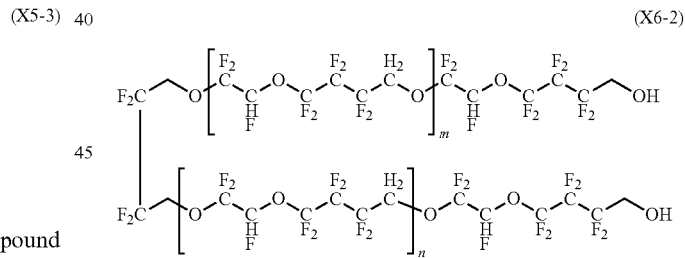
(X6-2)

NMR spectrum of compound (X6-2):
$^1$H-NMR (300.4 MHz, solvent: CDCl$_3$, reference: tetramethylsilane (TMS)) δ(ppm): 6.0(12H), 4.6(20H), 4.2(4H), 4.1(4H).
$^{19}$F-NMR (282.7 MHz, solvent: CDCl$_3$, reference: CFCl$_3$) δ(ppm): −85(24F), −90(24F), −120(20F), −122(4F), −123(4F), −126(24F), −144(12F)

Average of number m+n of units: 10

Preparation Example 7-3

Into a 50 mL eggplant flask to which a reflux condenser was connected, 20 g of compound (X6-2) obtained in Preparation Example 7-2, 2.4 g of a sodium fluoride powder, 20 g of AC-2000 and 18.8 g of CF$_3$CF$_2$CF$_2$OCF(CF$_3$)COF were added. In a nitrogen atmosphere, the content in the flask was stirred at 50° C. for 24 hours. The system was cooled to room temperature, the sodium fluoride powder was removed by a pressure filter, and excess $CF_3CF_2CF_2OCF(CF_3)COF$ and AC-2000 were distilled off under reduced pressure to obtain 24 g (yield: 100%) of compound (X6-3)

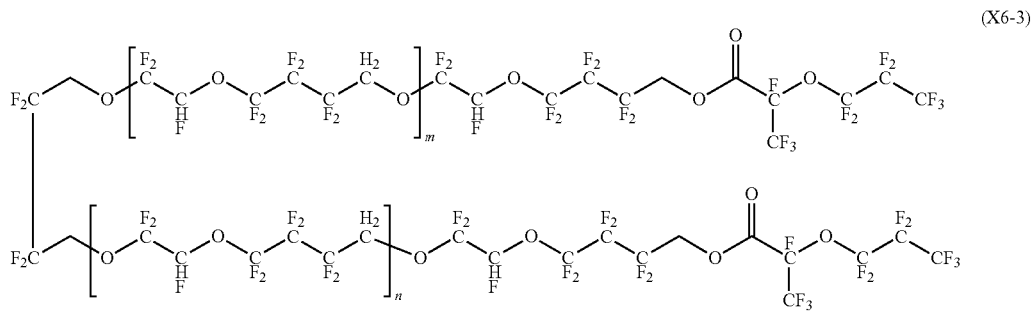

(X6-3)

NMR spectrum of compound (X6-3):
$^1$H-NMR (300.4 MHz, solvent: $CDCl_3$, reference: tetramethylsilane (TMS)) δ(ppm): 6.0(12H), 5.0(4H), 4.6(20H), 4.2(4H).
$^{19}$F-NMR (282.7 MHz, solvent: $CDCl_3$, reference: $CFCl_3$) δ(ppm): −79(4F), −81(6F), −82(6F), −85(24F), −90 (24F), −119(4F), −120(20F), −122(4F), −126(24F), −129 (4F), −131(2F), −144(12F).
Average of number m+n of units: 10.

Preparation Example 7-4

Into a 500 mL nickel reactor, 250 mL of $ClCF_2CFClCF_2OCF_2CF_2Cl$ (hereinafter referred to as "CFE-419") was put, followed by bubbling with nitrogen gas. After the oxygen gas concentration was sufficiently lowered, bubbling with 20 vol % fluorine gas diluted with nitrogen gas was conducted for 1 hour. A CFE-419 solution (concentration: 10 mass %, compound (X6-3): 24 g) of compound (X6-3) obtained in Preparation Example 7-3 was charged over a period of 6 hours. The ratio of the rate (mol/hour) of introduction of fluorine gas to the rate (mol/hour) of introduction of hydrogen atoms in the compound (X6-3) was controlled to be 2:1. After the charge of the compound (X6-3) was completed, a CFE-419 solution of benzene (concentration: 0.1 mass %, benzene: 0.1 g) was intermittently charged. After completion of the charge of the benzene, bubbling with fluorine gas was conducted for one hour, and finally, the system in the reactor was sufficiently replaced with nitrogen gas. The solvent was distilled off to obtain 25.3 g (yield: 90%) of compound (X6-4).

NMR spectrum of compound (X6-4):
$^{19}$F-NMR (282.7 MHz, solvent: $CDCl_3$, reference: $CFCl_3$) δ(ppm): −79(4F), −81(6F), −82(6F), −83(48F), −87 (44F), −124(48F), −129(4F), −131(2F).
Average of number m+n of units: 10

Preparation Example 7-5

Into a 50 mL eggplant flask, 25.3 g of compound (X6-4) obtained in Preparation Example 7-4, 2.2 g of sodium fluoride and 25 mL of AC-2000 were put, followed by stirring in an ice bath. 1.7 g of methanol was put, followed by stirring at 25° C. for 1 hour. After filtration, the filtrate was purified by column chromatography. 15 g (yield: 80%) of compound (X6-5) was obtained.

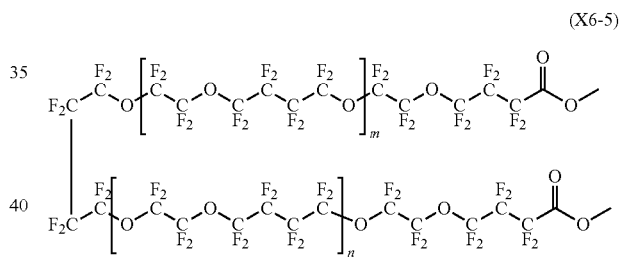

(X6-5)

NMR spectrum of compound (X6-5):
$^1$H-NMR (300.4 MHz, solvent: $CDCl_3$, reference: tetramethylsilane (TMS)) δ(ppm): 4.2(6H).
$^{19}$F-NMR (282.7 MHz, solvent: $CDCl_3$, reference: $CFCl_3$) δ(ppm): −83(44F), −87(44F), −119(4F), −124(44F).
Average of number m+n of units: 10

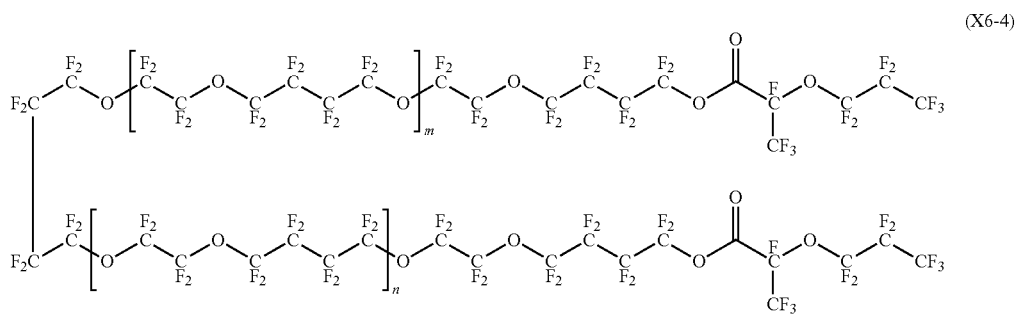

(X6-4)

Preparation Example 7-6

Into a 50 mL eggplant flask, 15 of compound (X6-5) obtained in Preparation Example 7-5, 3.2 g of $H_2NCH_2C(CH_2CH=CH_2)_3$ and 15 mL of AC-2000 were put, followed by stirring at 0° C. for 24 hours. The reaction crude liquid was purified by column chromatography to obtain three fractions each containing the desired product. 11.2 g (yield: 70%) of compound (X6-6) was obtained in total. The respective three fractions are taken as (C4-6a), (C4-6b) and (C4-6c). The fraction (C4-6c) was again purified by column chromatography to obtain fraction (C4-6d).

The fractions (C4-6a) to (C4-6c) contained compounds (X6-6) and (X6-7). Using the respective fractions, the ratio ($CF_3/CF_2$) was obtained by 19F-NMR. $CF_3$ in the ratio means the number of moles of the —$CF_3$ group present at one terminal of compound (X6-7) (—$CF_3$ group surrounded by the dotted line in the formula), and is observed at −85 to −87 ppm in the $^{19}$F-NMR spectrum. Further, $CF_2$ in the ratio means the total number of moles of the —$CF_2$— groups present in the vicinity of one terminal of compound (X6-7) (—$CF_2$— group surrounded by the dotted line in the formula) and the —$CF_2$— groups present in the vicinity of both terminals of compound (X6-6) (—$CF_2$— groups surrounded by dotted line in the formula), and is observed at −120 ppm in the $^{19}$F-NMR spectrum. It was confirmed that no compound (X6-7) was detected in the fraction (C4-6d).

$CF_3/CF_2$ in the fraction (C4-6a)=0.11
$CF_3/CF_2$ in the fraction (C4-6b)=0.06
$CF_3/CF_2$ in the fraction (C4-6c)=0.05

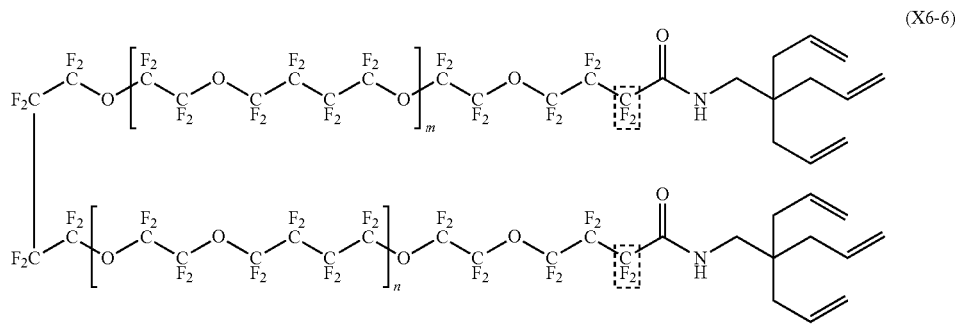

(X6-6)

NMR spectrum of compound (X6-6):
1H-NMR (300.4 MHz, solvent: $CDCl_3$, reference: tetramethylsilane (TMS)) δ(ppm): 6.1(6H), 5.2(12H), 3.4(4H), 2.1(12H). 19F-NMR (282.7 MHz, solvent: $CDCl_3$, reference: $CFCl_3$) δ(ppm): −83(44F), −87(44F), −120(4F), −124(44F).

Average of number m+n of units: 10

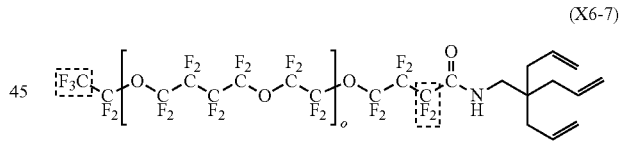

(X6-7)

Preparation Example 7-7

Into a 50 mL eggplant flask, 1 g of fraction (C4-6a) obtained in Preparation Example 7-6, 0.21 g of trimethoxysilane, 0.001 g of aniline, 1.0 g of AC-6000 and 0.0033 g of platinum/1,3-divinyl-1,1,3,3-tetramethyldisiloxane complex were put, followed by stirring at 25° C. overnight. The solvent and the like were distilled off under reduced pressure to obtain 1.2 g (yield: 100%) of mixture (M1).

Mixture (M1) contained compounds (1-1D) and (1-3A).
Using mixture (M1), by $^{19}$F-NMR, the ratio ($CF_3/CF_2$) was obtained in the same manner as in Preparation Example 7-6. The groups surrounded by the dotted line in the formulae are groups to be measured by $^{19}$F-NMR.

$CF_3/CF_2$ in the mixture (M1)=0.11

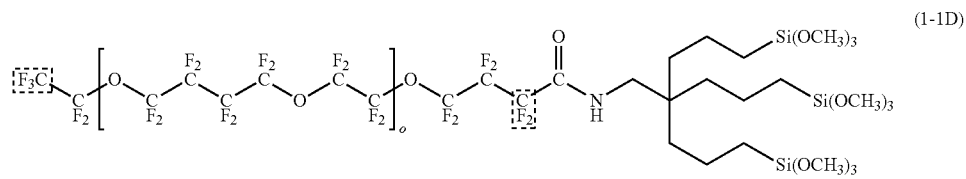

(1-1D)

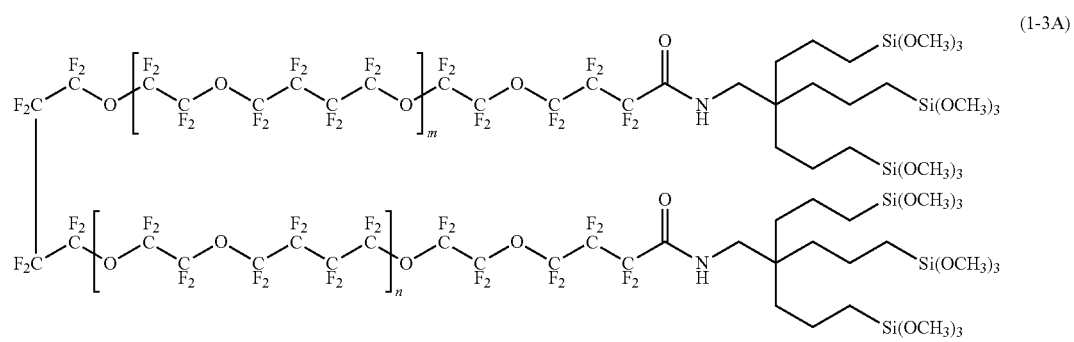

(1-3A)

NMR spectrum of compound (1-3A):
$^1$H-NMR (300.4 MHz, solvent: CDCl$_3$, reference: tetramethylsilane (TMS)) δ(ppm): 3.6(54H), 3.4(4H), 1.3(24H), 0.9(12H). $^{19}$F-NMR (282.7 MHz, solvent: CDCl$_3$, reference: CFCl$_3$) δ(ppm): −83(44F), −87(44F), −120(4F), −124(44F).

Average of number m+n of units: 10, Mn of compound (1-3A): 5,200

In the same manner as in Preparation Example 7-7, using the fraction (C4-6d) as the material, compound (1-4A) differing in the molecular weight from compound (1-3A) was obtained. Of compound (1-4A), peaks at −85 to −87 ppm were not detected in $^{19}$F-NMR.

Average of number m+n of units: 9, Mn of compound (1-4A): 4,900

With reference to Ex. 11-3 in WO2017/038830, into a 50 mL eggplant flask, 5 g of a mixture of compound (1-1X) (shown in Preparation Example 3) and the fraction (C4-6c) in a mass ratio of 1:1, 0.60 g of trimethoxysilane, 0.005 g of aniline, 5.0 g of AC-6000 and 0.01 g of platinum/1,3-divinyl-1,1,3,3-tetramethyldisiloxane complex were put, followed by stirring at 25° C. overnight. The solvent and the like were distilled off under reduced pressure to obtain 5.1 g of mixture (M3).

Mixture (M3) contained compounds (1-1B) and (1-3A).

Preparation Example 8

In accordance with Example 4 in JP-A-2015-199906, compound (1-3B) was obtained.

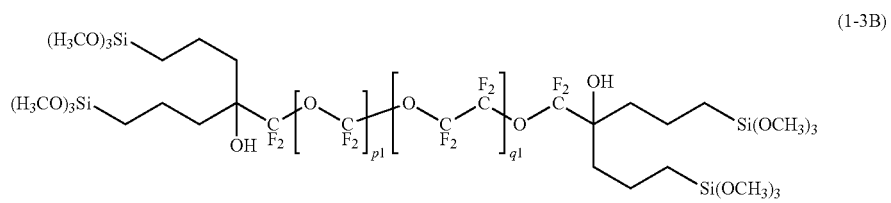

(1-3B)

In the above formula (1-3B), p11:q1≈47:53, p1+q1≈43.
Mn of compound (1-3B): 4,800

Preparation Example 9

Compound described in JP-A-2015-037541, paragraph [0048] was used as compound (1-3C).

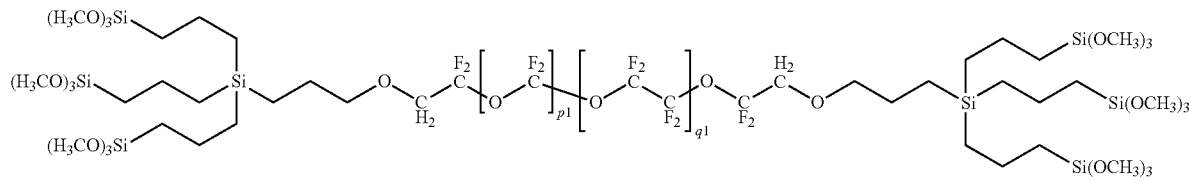

(1-3C)

In the above formula (1-3C), p1/q1=1.0, p1+q1≈45.
Mn of compound (1-3C): 5,390

Preparation Example 10

Into a 100 mL round bottom flask, 5 g of compound X6-5 obtained in accordance with Preparation Example 7-5, and 0.61 g of 3-aminopropyltrimethoxysilane were put, followed by stirring at room temperature for 3 hours. After completion of the reaction, unreacted compound and by-product were distilled off under reduced pressure to obtain compound (1-3D).

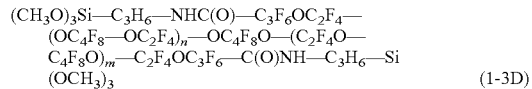

(1-3D)

Mn of compound (1-3D): 5,390

Ex. 1

Into Eirich Intensive Mixer EL-1 (manufactured by Nippon Eirich Co., Ltd., hereinafter referred to as "EL-1"), 240 g of amorphous silica SC5500-SQ (trade name, manufactured by Admatechs Company Limited) and 60 g of titania particles (manufactured by JUNSEI CHEMICAL CO., LTD.) were added, followed by stirring and mixing at 2,400 rpm for 30 seconds. The stirring rate was changed to 4,800 ppm, and 40 g of distilled water was added with stirring, followed by stirring at 4,800 rpm further for 60 seconds. Finally, stirring was conducted at 900 rpm for 5 minutes. The obtained particles were taken out from EL-1 and vacuum dried at 150° C. for 30 minutes and further fired at 1,150° C. for 1 hour to obtain sintered body 1.

On a molybdenum boat in a vacuum deposition apparatus (manufactured by ULVAC KIKO, Inc., VTR-350M), 10 of the sintered body 1 and 0.5 g of compound (3A) as deposition materials (deposition source) were disposed. In the vacuum deposition apparatus, a glass substrate (manufactured by AGC Inc., Dragontrail (registered trademark)) was disposed, and the vacuum deposition apparatus was evacuated of air until the pressure became 5×10−3 Pa or lower.

The boat on which the sintered body 1 was placed was heated to 2,000° C. so that the sintered body 1 was vacuum-deposited on the glass substrate to form an undercoat layer having a thickness of 10 nm.

Further, the boat on which the compound (3A) was placed was heated to 700° C. so that the compound (3A) was vacuum-deposited on the surface of the undercoat layer to form a water/oil repellent layer having a thickness of 10 nm, followed by heat treatment at 140° C. for 30 minutes. In such a manner, the water/oil repellent layer-provided substrate in Ex. 1 was obtained.

Ex. 2 and 3

The water/oil repellent layer-provided substrates in Ex. 2 and 3 were obtained in the same manner as in Ex. 1 except that a sintered body obtained by adjusting the amounts of the amorphous silica and the titania particles so that the ratio of the total molar concentration of titanium, zirconium and aluminum in the sintered body to the molar concentration of silicon in the sintered body would be as identified in Table 1.

Ex. 4

The water/oil repellent layer-provided substrate in Ex. 4 was obtained in the same manner as in Ex. 1 except that a sintered body obtained using aluminum oxide particles (manufactured by NIPPON STEEL Chemical & Materials Co., Ltd.) instead of the titania particles and by adjusting the amounts of the amorphous silica and the aluminum oxide particles so that the ratio of the total molar concentration of titanium, zirconium and aluminum in the sintered body to the molar concentration of silicon in the sintered body would be as identified in Table 1, was used.

Ex. 5

The water/oil repellent layer-provided substrate in Ex. 5 was obtained in the same manner as in Ex. 1 except that a sintered body obtained using zirconium oxide particles (manufactured by JUNSEI CHEMICAL CO., LTD.) instead of the titania particles and by adjusting the amounts of the amorphous silica and the zirconium oxide particles so that the ratio of the total molar concentration of titanium, zirconium and aluminum in the sintered body to the molar concentration of silicon in the sintered body would be as identified in Table 1, was used.

Ex. 6

The water/oil repellent layer-provided substrate in Ex. 6 was obtained in the same manner as in Ex. 1 except that a sintered body obtained by using soda ash (manufactured by Soda Ash Japan Co., Ltd.) together with the amorphous silica and the titania particles and by adjusting the amounts of the amorphous silica, the titania particles and the soda ash so that the ratio of the total molar concentration of titanium, zirconium and aluminum in the sintered body to the molar concentration of silicon in the sintered body would be as identified in Table 1, was used.

Ex. 7

The water/oil repellent layer-provided substrate in Ex. 7 was obtained in the same manner as in Ex. 1 except that a sintered body obtained by using boric acid particles (Optibor: trade name, manufactured by HAYAKAWA & Co., LTD.) together with the amorphous silica and the titania particles and by adjusting the amounts of the amorphous silica, the titania particles and the boric acid particles so that the ratio of the total molar concentration of titanium, zirconium and aluminum in the sintered body to the molar concentration of silicon in the sintered body would be as identified in Table 1, was used.

Ex. 8

On a molybdenum boat in a vacuum deposition apparatus (manufactured by ULVAC KIKO, Inc., VTR-350M), 30 g of silicon oxide (manufactured by Canon Optron, Inc.) and 0.5 g of compound (3A) as deposition materials (deposition source) were disposed. In the vacuum deposition apparatus, a glass substrate was disposed, and the vacuum deposition apparatus was evacuated of air until the pressure became $5 \times 10^{-3}$ Pa or lower.

The boat on which silicon oxide was placed was heated to 2,000° C. so that the silicon oxide was vacuum-deposited on the glass substrate to form an undercoat layer having a thickness of 10 nm.

Further, the boat on which the compound (3A) was placed was heated to 700° C. so that the compound (3A) was vacuum-deposited on the surface of the undercoat layer to form a water/oil repellent layer having a thickness of 10 nm, followed by heat treatment at 140° C. for 30 minutes. In such a manner, the water/oil repellent layer-provided substrate in Ex. 8 was obtained.

Ex. 9

The water/oil repellent layer-provided substrate in Ex. 9 was obtained in the same manner as in Ex. 1 except that a sintered body obtained by adjusting the amounts of the amorphous silica and the titania particles so that the ratio of the total molar concentration of titanium, zirconium and aluminum in the sintered body to the molar concentration of silicon in the sintered body would be as identified in Table 1, was used.

Ex. 10

To 109 g of an isopropyl alcohol solution of 0.5 mass % tetraethyl orthosilicate (manufactured by Wako Pure Chemical Industries, Ltd.), 50 g of a methanol solution of 0.1 mass % $Ti(OCH_3)_4$ (manufactured by Sigma-Aldrich) was added, followed by stirring for 10 minutes to obtain a coating fluid for forming undercoat layer.

One surface of a glass substrate (Dragontrail (registered trademark), manufactured by AGC Inc.) was subjected to corona discharge treatment by a high frequency power supply (CG102A: trade name, manufactured by Kasuga Electric Works Ltd.) under conditions of 80V and 3.5 A.

To the surface of the glass substrate subjected to the corona discharge treatment, the coating fluid for forming undercoat layer was applied by spin coating at a number of revolutions of 3,000 rpm for a rotation time of 20 seconds to form a wet film, which was fired at 300° C. for 30 minutes to form an undercoat layer-provided substrate (thickness of the undercoat layer: 10 nm).

On a molybdenum boat in a vacuum deposition apparatus (VTR-350M: trade name, manufactured by ULVAC KIKO, Inc.), 0.5 g of compound (3A) as a deposition material (deposition source) was disposed. In the vacuum deposition apparatus, the undercoat layer-provided substrate was disposed, and the vacuum deposition apparatus was evacuated of air until the pressure became $5 \times 10^{-3}$ Pa or lower. The boat was heated to 700° C. so that the compound (3A) was vacuum-deposited on the surface of the undercoat layer to form a water/oil repellent layer having a thickness of 10 nm, followed by heat treatment at 140° C. for 30 minutes. In such a manner, the water/oil repellent layer-provided substrate in Ex. 10 was obtained.

Ex. 11 to 23

The water/oil repellent layer-provided substrate was obtained in the same manner as in Ex. 1 except that compound as identified in Table 1 or 2 was used instead of compound (3A) as the fluorinated compound, and that the undercoat layer was formed by using the materials as identified in Table 1.

Mixture (M1) is a mixture containing 50 mass % each of compound (1-1A) and compound (1-2B). Mixture (M4) is a mixture containing 50 mass % of compound (1-3A) and 50 mass % of compound (1-1C).

The above measurement of physical properties and evaluation were conducted in each Ex. The evaluation results are shown in Table 1.

In Tables, "titanium, zirconium and aluminum/silicon (molar ratio)" means the ratio of the total molar concentration of titanium, zirconium and aluminum in the deposition material, the coating fluid or the undercoat layer to the molar concentration of silicon in the deposition material, the coating fluid or the undercoat layer. Further, "sodium/silicon (molar ratio)" means the ratio of the molar concentration of sodium in the deposition material, the coating fluid or the undercoat layer to the molar concentration of silicon in the deposition material, the coating fluid or the undercoat layer. Further, "boron/silicon (molar ratio)" means the ratio of the molar concentration of boron in the deposition material, the coating fluid or the undercoat layer to the molar concentration of silicon in the deposition material, the coating fluid or the undercoat layer.

| | | Material for forming undercoat layer | | | | | |
|---|---|---|---|---|---|---|---|
| | Fluorinated compound | Material species | | Form | Firing temperature at the time of forming deposition material | Titanium, zirconium and aluminum/ silicon (molar ratio) | Sodium/ silicon (molar ratio) | Boron/ silicon (molar ratio) |
| Ex. 1 | (3A) | Amorphous silica | Titanium oxide particles | — | Sintered body | 1150° C. | 0.28 | 0.00 | 0.00 |

-continued

| | | Material species | | | Form | Firing temperature | Ti,Zr,Al/Si | Na/Si | B/Si |
|---|---|---|---|---|---|---|---|---|
| Ex. 2 | (3A) | Amorphous silica | Titanium oxide particles | — | Sintered body | 1150° C. | 0.43 | 0.00 | 0.00 |
| Ex. 3 | (3A) | Amorphous silica | Titanium oxide particles | — | Sintered body | 1150° C. | 1.86 | 0.00 | 0.00 |
| Ex. 4 | (3A) | Amorphous silica | Aluminum oxide particles | — | Sintered body | 1150° C. | 0.47 | 0.00 | 0.00 |
| Ex. 5 | (3A) | Amorphous silica | Zirconium oxide particles | — | Sintered body | 1150° C. | 0.43 | 0.00 | 0.00 |
| Ex. 6 | (3A) | Amorphous silica | Titanium oxide particles | Soda ash | Sintered body | 1150° C. | 0.35 | 0.06 | 0.00 |
| Ex. 7 | (3A) | Amorphous silica | Titanium oxide particles | Boric acid particles | Sintered body | 1150° C. | 0.35 | 0.00 | 0.06 |
| Ex. 8 | (3A) | SiO$_2$ | — | — | Commercial deposition source | — | 0.00 | 0.00 | 0.00 |
| Ex. 9 | (3A) | Amorphous silica | Zirconium oxide particles | — | Sintered body | 1150° C. | 5.67 | 0.00 | 0.00 |
| Ex. 10 | (3A) | Si(OCH$_2$CH$_3$)$_4$ | Ti(OCH$_3$)$_4$ | — | Coating fluid | — | — | — | — |
| Ex. 11 | (1-1A) | Amorphous silica | Titanium oxide particles | — | Sintered body | 1150° C. | 0.42 | 0.00 | 0.00 |

| | Undercoat layer | | | Evaluation results | | |
|---|---|---|---|---|---|---|
| | Titanium, zirconium and aluminum/silicon (molar ratio) | Sodium/silicon (molar ratio) | Boron/silicon (molar ratio) | Abrasion resistance 1 | Abrasion resistance 2 | Abrasion resistance 3 |
| Ex. 1 | 0.08 | 0.00 | 0.00 | ○ | X | X |
| Ex. 2 | 0.11 | 0.00 | 0.00 | ◎ | ○ | X |
| Ex. 3 | 0.52 | 0.00 | 0.00 | ○ | X | — |
| Ex. 4 | 0.11 | 0.00 | 0.00 | ○ | X | — |
| Ex. 5 | 0.11 | 0.00 | 0.00 | ○ | X | — |
| Ex. 6 | 0.41 | 0.04 | 0.00 | ◎ | ○ | X |
| Ex. 7 | 0.32 | 0.00 | 0.29 | ◎ | X | X |
| Ex. 8 | 0.00 | 0.00 | 0.00 | X | X | — |
| Ex. 9 | 4.00 | 0.00 | 0.00 | X | X | — |
| Ex. 10 | 0.11 | 0.00 | 0.00 | ◎ | ○ | X |
| Ex. 11 | 0.11 | 0.00 | 0.00 | ◎ | ◎ | ○ |

| | Fluorinated compound | Material species | | | Form | Firing temperature at the time of forming deposition material | Titanium, zirconium and aluminum/silicon (molar ratio) | Sodium/silicon (molar ratio) | Boron/silicon (molar ratio) |
|---|---|---|---|---|---|---|---|---|---|
| Ex. 12 | (1-1B) | Amorphous silica | Titanium oxide particles | — | Sintered body | 1150° C. | 0.41 | 0.00 | 0.00 |
| Ex. 13 | (1-1C) | Si(OCH$_2$CH$_3$)$_4$ | Ti(OCH$_3$)$_4$ | — | Coating fluid | — | — | — | — |
| Ex. 14 | (1-2A) | Amorphous silica | Titanium oxide particles | — | Sintered body | 1150° C. | 0.44 | 0.00 | 0.00 |
| Ex. 15 | (1-2B) | Si(OCH$_2$CH$_3$)$_4$ | Ti(OCH$_3$)$_4$ | — | Coating fluid | — | — | — | — |
| Ex. 16 | (1-3B) | Amorphous silica | Titanium oxide particles | Boric acid particles | Sintered body | 1150° C. | 0.36 | 0.00 | 0.06 |
| Ex. 17 | (1-3C) | Amorphous silica | Titanium oxide particles | Soda ash | Sintered body | 1150° C. | 0.36 | 0.06 | 0.00 |
| Ex. 18 | (1-4A) | Amorphous silica | Titanium oxide particles | — | Sintered body | 1150° C. | 0.41 | 0.00 | 0.00 |
| Ex. 19 | (M1) | Amorphous silica | Titanium oxide particles | — | Sintered body | 1150° C. | 0.42 | 0.00 | 0.00 |
| Ex. 20 | (M2) | Amorphous silica | Titanium oxide particles | — | Sintered body | 1150° C. | 0.40 | 0.00 | 0.00 |
| Ex. 21 | (M3) | Si(OCH2CH3)4 | Ti(OCH$_3$)$_4$ | — | Coating fluid | — | — | — | — |
| Ex. 22 | (M4) | Amorphous silica | Titanium oxide particles | Soda ash | Sintered body | 1150° C. | 0.34 | 0.06 | 0.00 |
| Ex. 23 | (1-3D) | Amorphous silica | Titanium oxide particles | — | Sintered body | 1150° C. | 0.42 | 0 | 0 |

-continued

| | Undercoat layer | | | Evaluation results | | |
|---|---|---|---|---|---|---|
| | Titanium, zirconium and aluminum/silicon (molar ratio) | Sodium/silicon (molar ratio) | Boron/silicon (molar ratio) | Abrasion resistance 1 | Abrasion resistance 2 | Abrasion resistance 3 |
| Ex. 12 | 0.10 | 0.00 | 0.00 | ⊚ | ⊚ | ○ |
| Ex. 13 | 0.11 | 0.00 | 0.00 | ⊚ | ⊚ | ○ |
| Ex. 14 | 0.12 | 0.00 | 0.00 | ⊚ | ⊚ | △ |
| Ex. 15 | 0.12 | 0.00 | 0.00 | ⊚ | ⊚ | ○ |
| Ex. 16 | 0.33 | 0.00 | 0.29 | ⊚ | ○ | ○ |
| Ex. 17 | 0.42 | 0.04 | 0.00 | ⊚ | ○ | ○ |
| Ex. 18 | 0.11 | 0.00 | 0.00 | ⊚ | ○ | ○ |
| Ex. 19 | 0.12 | 0.00 | 0.00 | ⊚ | ⊚ | ⊚ |
| Ex. 20 | 0.12 | 0.00 | 0.00 | ⊚ | ○ | ○ |
| Ex. 21 | 0.11 | 0.00 | 0.00 | ⊚ | ○ | ⊚ |
| Ex. 22 | 0.40 | 0.04 | 0.00 | ⊚ | ○ | ⊚ |
| Ex. 23 | 0.10 | 0.00 | 0.00 | ○ | × | × |

As shown in Table 1, it was confirmed that the water/oil repellent layer-provided substrate having a water/oil repellent layer excellent in abrasion resistance was obtained by using an undercoat layer which contains an oxide containing silicon and at least one element selected from the group consisting of titanium, zirconium and aluminum, and has a ratio of the total molar concentration of titanium, zirconium and aluminum to the molar concentration of silicon of from 0.03 to 7.

INDUSTRIAL APPLICABILITY

The water/oil repellent layer-provided substrate of the present invention is useful for various applications for which it is required to impart water/oil repellency. For example, it may be used for a display input device such as a touch panel, a transparent glass or transparent plastic member, a lens of eyeglasses or the like, a kitchen antifouling member, a water repellent moistureproof member or antifouling member of electronic device, a heat exchanger or a battery, a toiletry antifouling member, a member which requires liquid repellency while conducting electricity, a water repellent/waterproof/water sliding member of a heat exchanger, or a surface low-friction member for a vibrating strainer or the inside of a cylinder, etc. More specific examples of application include a front protective plate, an antireflection plate, a polarizing plate, an antiglare plate or a surface thereof having an antireflection film, of a display, an apparatus having a display input device of which the screen is operated by human fingers or hands, such as a touch panel sheet or a touch panel display of an apparatus such as a mobile phone (e.g. a smartphone), a personal digital assistant, a gaming machine or a remote controller (for example, glass or film to be used for e.g. display portion, or glass or film to be used for exterior member other than the display portion). In addition, a decorative building material for restroom, bathroom, lavatory, kitchen and the like, a waterproof member for a wiring board, a water repellent/waterproof/water sliding member of a heat exchanger, a water repellent member of a solar cell, a waterproof/water repellent member of a printed wiring board, a waterproof/water repellent member of an electronic equipment casing or an electronic member, an insulating property-improving member of a power transmission line, a waterproof/water repellent member of a filter, a waterproof member of an electromagnetic wave absorption material or an acoustic material, an antifouling member for bathroom, kitchen instrument and toiletry, a surface low-friction member of a vibrating strainer or the inside of a cylinder, a surface protective member of a machine component, a vacuum apparatus component, a bearing component, a member for a transport such as an automobile, an industrial tool, etc. may be mentioned.

This application is a continuation of PCT Application No. PCT/JP2019/043963, filed on Nov. 8, 2019, which is based upon and claims the benefit of priority from Japanese Patent Application No. 2018-213072 filed on Nov. 13, 2018 and Japanese Patent Application No. 2018-243170 filed on Dec. 26, 2018. The contents of those applications are incorporated herein by reference in their entireties.

REFERENCE SYMBOLS

10: water/oil repellent layer-provided substrate
12: substrate
14: undercoat layer
16: water/oil repellent layer

What is claimed is:

1. A water/oil repellent layer-provided substrate comprising a substrate, an undercoat layer and a water/oil repellent layer in this order,
   wherein the water/oil repellent layer comprises a condensate of a fluorinated compound having a reactive silyl group,
   the undercoat layer contains an oxide containing:
   (i) silicon,
   (ii) at least one element selected from the group consisting of titanium, zirconium and aluminum, and
   (iii) at least one alkali metal element selected from the group consisting of sodium, lithium, and potassium, and
   the ratio of the total molar concentration of titanium, zirconium and aluminum in the undercoat layer to the molar concentration of silicon in the undercoat layer is from 0.03 to 0.7.

2. The water/oil repellent layer-provided substrate according to claim 1, wherein the oxide contains silicon, and at least one element selected from the group consisting of titanium and zirconium.

3. The water/oil repellent layer-provided substrate according to claim 1, wherein the oxide contains silicon and titanium.

4. The water/oil repellent layer-provided substrate according to claim 1, wherein the oxide contains sodium.

5. The water/oil repellent layer-provided substrate according to claim 1, wherein the ratio of the molar concentration of the alkali metal element to the molar concentration of silicon is at most 1.0.

6. A method for producing the water/oil repellent layer-provided substrate of claim 1,
which comprises forming on a substrate an undercoat layer containing an oxide containing (i) silicon, (ii) at least one element selected from the group consisting of titanium, zirconium and aluminum, and (iii) at least one alkali metal element selected from the group consisting of sodium, lithium, and potassium, the ratio of the total molar concentration of titanium, zirconium and aluminum to the molar concentration of silicon being from 0.03 to 0.7, by a wet coating method using a coating fluid containing a compound containing silicon, at least one compound selected from the group consisting of a compound containing titanium, a compound containing zirconium and a compound containing aluminum, and a liquid medium, and
forming on the undercoat layer the water/oil repellent layer comprising a condensate of a fluorinated compound having a reactive silyl group.

7. A deposition material to be used for forming an undercoat layer of a water/oil repellent layer comprising a condensate of a fluorinated compound having a reactive silyl group,
wherein the deposition material contains an oxide containing:
(i) silicon,
(ii) at least one element selected from the group consisting of titanium, zirconium and aluminum, and
(iii) at least one alkali metal element selected from the group consisting of sodium, lithium, and potassium,
the ratio of the total molar concentration of titanium, zirconium and aluminum to the molar concentration of silicon is from 0.2 to 4, and
wherein the deposition material is in the form of a molten body, a sintered body, or granules.

8. The deposition material according to claim 7, wherein the oxide contains silicon and at least one element selected from the group consisting of titanium and zirconium.

9. The deposition material according to claim 7, wherein the oxide contains silicon and titanium.

10. The deposition material according to claim 7, wherein the oxide contains sodium.

11. The deposition material according to claim 7, wherein the oxide further contains at least one metal element selected from the group consisting of nickel, iron, molybdenum and tungsten, and
the ratio of the molar concentration of the metal element to the molar concentration of silicon is at most 0.01.

12. A method for producing a water/oil repellent layer-provided substrate comprising a substrate, an undercoat layer and a water/oil-repellent layer in this order,
which comprises forming on the substrate the undercoat layer containing an oxide containing (i) silicon, (ii) at least one element selected from the group consisting of titanium, zirconium and aluminum, and (iii) at least one alkali metal element selected from the group consisting of sodium, lithium, and potassium, the ratio of the total molar concentration of titanium, zirconium and aluminum to the molar concentration of silicon being from 0.03 to 0.7, by a deposition method using the deposition material as defined in claim 7, and
forming on the undercoat layer the water/oil repellent layer comprising a condensate of a fluorinated compound having a reactive silyl group.

\* \* \* \* \*